US005801389A

United States Patent [19]
Mizutani et al.

[11] Patent Number: 5,801,389
[45] Date of Patent: Sep. 1, 1998

[54] ACOUSTO-OPTIC MODULATOR, POSITION DETECTOR USING IT, AND PROJECTION EXPOSURE APPARATUS

[75] Inventors: Hidoe Mizutani, Yokohama; Kazuya Ota, Tokyo, both of Japan

[73] Assignee: Nikon Corporation, Tokyo, Japan

[21] Appl. No.: 688,800

[22] Filed: Jul. 31, 1996

Related U.S. Application Data

[63] Continuation-in-part of Ser. No. 470,889, Jun. 6, 1995, Pat. No. 5,569,929, and a continuation-in-part of Ser. No. 452,362, May 30, 1995, abandoned, and a continuation-in-part of Ser. No. 616,993, Mar. 14, 1996, abandoned.

[51] Int. Cl.$^6$ ............................................. G01N 21/86
[52] U.S. Cl. ............................................. 250/548; 356/400
[58] Field of Search ............................ 250/548, 226; 356/399–401, 351, 356, 363

[56] References Cited

U.S. PATENT DOCUMENTS

| | | | |
|---|---|---|---|
| 5,070,250 | 12/1991 | Komatsu et al. | 250/548 |
| 5,329,354 | 7/1994 | Yamamoto et al. | 356/349 |
| 5,347,356 | 9/1994 | Ota et al. | 356/401 |
| 5,488,230 | 1/1996 | Mizutani et al. | 250/548 |

FOREIGN PATENT DOCUMENTS

| | | |
|---|---|---|
| 2-227604 | 9/1990 | Japan. |
| 5-55114 | 3/1993 | Japan. |

*Primary Examiner*—Stephone B. Allen
*Attorney, Agent, or Firm*—Foley & Lardner

[57] ABSTRACT

In a position detecting apparatus, a light beam from a white light source is guided through a collimator lens etc. to be converted into a parallel beam, and this parallel beam is incident to a first acousto-optic modulator (AOM) and a second acousto-optic modulator positioned with a spacing by which a phase difference between diffracted light is approximately $m\pi$ (where m is an integer). Traveling waves of slightly different frequencies opposite to each other are supplied in opposite directions to the two acousto-optic modulators, and the position detecting apparatus executes position detection by the heterodyne interference method as guiding a beam comprised of +first-order diffracted light from the acousto-optic modulators and a beam comprised of −first-order diffracted light from the acousto-optic modulators through an objective lens to project them with a predetermined intersecting angle onto a diffraction grating mark.

45 Claims, 17 Drawing Sheets

ACOUSTO-OPTIC MODULATOR, POSITION DETECTOR USING IT, AND PROJECTION EXPOSURE APPARATUS

RELATED APPLICATIONS

This is a continuation-in-part application of applications Ser. No. 08/470,889 filed on Jun. 6, 1995, now U.S. Pat. No. 5,569,929, Ser. No. 08/452,362 filed on May 30, 1995, now abandoned and Ser. No. 08/616,993 filed on Mar. 14, 1996, now abandoned.

BACKGROUND OF THE INVENTION

1. Field of the Invention

The present invention relates to an acousto-optic modulator, a heterodyne position detector using it, and a projection exposure apparatus for fabricating semiconductor devices or liquid crystal display devices, etc. while positioning a wafer and a mask with high accuracy by the position detector.

2. Related Background Art

In recent years, employed in order to form fine patterns such as semiconductor devices at high resolution are projection exposure apparatus for projecting an image of patterns on a reticle (or photomask, etc.) to a wafer (or glass plate, etc.) coated with a photoresist to effect exposure thereon. So-called steppers, which perform exposure of patterns of reticle in each shot area on the wafer by the step-and-repeat method, have frequently been used heretofore, but projection exposure apparatus of the step-and-scan method (scanning exposure method), which perform exposure by synchronously scanning the reticle and wafer relative to a projection optical system, are ing used recently. Since semiconductor devices etc. are generally formed in a lamination structure of multi-layer circuit patterns on the wafer, high-accuracy positioning (alignment) is required between each shot area on the wafer and the reticle in the projection exposure apparatus.

A position detector that can perform position detection with high accuracy utilizing the heterodyne interference method is disclosed, for example, in Japanese Laid-open Patent Application No. 2-227604. This position detector is constructed in such an arrangement that a light beam from a laser light source is split into two beams by a beam splitter or the like and thereafter the respective light beams are let to pass through different, respective acousto-optic modulators (AOM), thereby providing a specific frequency difference between the two beams. Then the two beams with the frequency difference are applied in two respective directions to a diffraction grating mark on the reticle (reticle mark) and to a diffraction grating mark on the wafer (wafer mark). Photodetectors convert beams of interference light (heterodyne beams), each consisting of diffracted light emerging in a same direction from each diffraction grating mark, into two beat signals. In this case, because the two beat signals each have a frequency equal to the frequency difference given by the two acousto-optic modulators as described above and a phase corresponding to a position of the associated diffraction grating mark, the positions of the two diffraction grating marks are detected from those two beat signals, and based thereon, positioning is made between the reticle and the wafer.

The position detector as disclosed in Japanese Laid-open Patent Application No. 2-227604 cited previously was of a type in which the two light beams separated by the beam splitter or the like are modulated by the different acousto-optic modulators, and thus, the structure thereof was complicated. Since an optical path difference between the two light beams separated was likely to become longer than the wavelength, monochromatic light (light of a single wavelength) such as laser beam had to be used as light for position detection, which was subject to negative influence of thin-film interference due to the photoresist etc. deposited on the wafer.

Further, because the wafer is generally subjected to various processes, a cross section of the wafer mark could be destroyed bit by bit, whereby the cross section of wafer mark would become asymmetric. In this case, where the light for position detection was monochromatic light, there were cases that position detection accuracy was degraded by the asymmetry of the wafer mark (diffraction grating mark).

SUMMARY OF THE INVENTION

It is one object of the present invention to provide a position detecting apparatus having two-beam making means for making two beams having mutually different frequencies, an objective optical system for condensing the two beams from the two-beam making means to apply these two beams condensed in two predetermined directions to a diffraction-grating-like mark formed on a detected object, and a photoelectric detector for photoelectrically detecting interference light consisting of a plurality of diffracted light beams emergent from the diffraction-grating-like mark, wherein a position of the detected object is detected based on a detection signal of the photoelectric detector. In the apparatus, the two-beam making means comprises light source means for supplying a light beam containing multi-wavelength light or a light beam of a single wavelength, and an acousto-optic modulator for splitting the light beam from the light source means into two light beams having mutually different frequencies, wherein ultrasonic waves with different frequencies traveling in mutually opposite directions are supplied into a predetermined ultrasonic acting area in the acousto-optic modulator.

In this case, an example of the predetermined ultrasonic acting area in the acousto-optic modulator is one formed in an acousto-optic medium. Another example of the predetermined ultrasonic acting area ranges over a plurality of acousto-optic media adjacent to each other, and ultrasonic waves traveling alternately in opposite directions are supplied into the plurality of respective acousto-optic media (one wave for each medium).

It is further object of the present invention to provide an acousto-optic modulator spliting an incident light beam into two light beams having mutually different frequencies, and having an acousto-optic medium, and ultrasonic generating means for supplying ultrasonic waves with different frequencies traveling in mutually opposite directions into the acousto-optic medium. In the modulator, the ultrasonic waves with different frequencies traveling in the opposite directions are present in a common ultrasonic acting area in the acousto-optic medium.

It is more further object of the present invention to provide an acousto-optic modulator sliting an incident light beam into two light beams having mutually different frequencies, and having a plurality of acousto-optic media disposed adjacent to each other, and ultrasonic generating means for supplying ultrasonic waves with different frequencies traveling alternately in opposite directions into the plurality of respective acousto-optic media, a wave for one medium. The plurality of acousto-optic media form a common ultrasonic acting area.

In the above description the acousto-optic modulators were used to effect the Bragg diffraction, but those utilizing the Raman-Nath diffraction may also be applicable instead thereof.

It is more further object of the present invention to provide a position detecting apparatus having two-beam making means for making two light beams having mutually different frequencies, an objective optical system for condensing the two light beams from the two-beam making means to apply these two light beams condensed in two predetermined directions to a diffraction-grating-like mark formed on a detected object, and a photoelectric detector for photoelectrically detecting interference light consisting of a plurality of diffracted light beams emergent from the diffraction-grating-like mark, wherein a position of the detected object is detected based on a detection signal of the photoelectric detector. In the apparatus, the two-beam making means comprises light source means for supplying a light beam containing multi-wavelength light or a light beam of a single wavelength, and an acousto-optic modulator for splitting the light beam from the light source means into two light beams having mutually different frequencies, wherein ultrasonic waves with different frequencies traveling both in a same direction are supplied into two adjacent ultrasonic acting areas in the acousto-optic modulator.

In the position detecting apparatus, the two-beam making means supplies two light beams with mutually different frequencies, and position detection is carried out at high accuracy by the heterodyne interference method using those two light beams. At this time, the two-beam making means used in these position detecting apparatus uses a single acousto-optic modulator to make the two light beams with mutually different frequencies and to beat down the frequency difference between the two light beams to a predetermined value (for example, a value below about 1 MHz). However, the acousto-optic modulator used in the position detecting apparatus is different in structure from that in the second position detecting apparatus. First, the acousto-optic modulator used in the position detecting apparatus is described.

It is further object of the present invention to provide a position detecting apparatus of the heterodyne interference type that can gain optical beat signals with high SN ratios in a simple arrangement while maintaining characteristics of easy adjustment of optical system and capability of using light of plural wavelengths and that has a high utilization factor of light for position detection. The position detecting apparatus according to the present invention is a position detecting apparatus which has two-beam generating means for generating two beams having mutually different frequencies, an objective optical system for condensing the two beams from the two-beam generating means to project the two beams in two predetermined directions to a diffraction grating mark formed on a detected object, and a photoelectric detector for photoelectrically detecting interference light comprised of a plurality of diffracted light beams occurring from the diffraction grating mark, and which detects a position of the detected object, based on a detection signal from the photoelectric detector, wherein the two-beam generating means comprises light source means for generating a light beam containing light of plural wavelengths or a light beam of a single wavelength, and a plurality of acousto-optic elements for forming the two beams having the mutually different frequencies from the light beam from the light source means and traveling directions of ultrasonic waves in the plurality of acousto-optic elements are set to be alternately opposite, and a spacing (s) along a traveling direction of the light beam between ultrasonic acting regions of two adjacent acousto-optic elements out of the plurality of acousto-optic elements is set so that a phase difference ∅ between diffracted light beams each diffracted in a same direction from the ultrasonic acting regions of the two adjacent acousto-optic elements may be within the following range, using an integer m.

$$(m-\tfrac{1}{3})\pi < \phi < (m+\tfrac{1}{3})\pi \qquad (28)$$

wherein Letting s be a spacing calculated as a value in the air along the traveling direction of beam between the ultrasonic acting regions of the two adjacent acousto-optic elements out of the plurality of acousto-optic elements.

The above condition of Eq. (28) is equivalent to that the spacing B satisfies either next Eq. (29) or Eq. (30).

$$(m-\tfrac{1}{3})\lambda^2/\Lambda < s < (m+\tfrac{1}{3})\lambda^2/\Lambda \qquad (29)$$

or, $$(m-\tfrac{1}{3})v^2/(\lambda f^2) < s < (m+\tfrac{1}{3})v^2/(\lambda f^2) \qquad (30)$$

In the above equations, meaning of each variable is given as follows:

λ: an average wavelength in the air of the two beams having the mutually different frequencies, Λ: an average wavelength of the ultrasonic waves in the two adjacent acousto-optic elements, v: a sound velocity of the ultrasonic waves, f: an average frequency of the ultrasonic waves, m: an integer.

In this case, the apparatus may be modified in such a manner that, for example as shown in FIG. 21, a relay optical system (154A, 154B) is disposed in two, predetermined, adjacent, acousto-optic elements (17A', 17B) among the plurality of acousto-optic elements and that the ultrasonic acting regions in the two, predetermined, adjacent, acousto-optic elements are located at the positions conjugate with each other with respect to the relay optical system.

A desirable arrangement is such that, for example as shown in FIG. 22, a field stop (157) for interrupting noise light in the periphery of the two beams of mutually different frequencies is disposed at the position substantially conjugate with the middle point in the traveling direction of light between the ultrasonic acting regions of the plurality of acousto-optic elements (17A, 17B).

Since the position detecting apparatus of the present invention as described above is so arranged that the two-beam generating means supplies the two beams having the mutually different frequencies, position detection is carried out at high accuracy by the heterodyne interference method using the two beams. On this occasion, the two beam generating means generates the two beams having the mutually different frequencies, using the plurality of acousto-optic elements (17A, 17B), and a difference between the frequencies of these two beams is beaten down to a predetermined value (for example, to about 1 or less MHz).

Generally, for example in FIG. 20, a situation obtained when an ultrasonic wave is applied to an acousto-optic element (17A) is equivalent to that a so-called phase grating (compressional wave) is formed in the acousto-optic element. If, for example, the zeroth-order light beam and the first-order diffracted light beam are extracted from the light diffracted by the phase grating to be again focused, interference fringes are formed at a pitch equal to the pitch of the phase grating. If the ultrasonic wave is a traveling wave, the phase grating and the interference fringes as an image thereof move at speed of sound. This means that the first-order diffracted light is subjected to frequency modulation, and its modulation frequency f is expressed by the following equation where V is a moving velocity of the interference fringes and p is the pitch of the interference fringes.

$$f = V/p \qquad (31)$$

Alternatively, the modulation frequency f is also given by the following equation where v' is the sound velocity of the ultrasonic wave and $\Lambda'$ is the wavelength of the ultrasonic wave.

$$f = v'/\Lambda' \qquad (32)$$

Normally, the sound speed v' is several thousand m/s and the wavelength $\Lambda'$ is several ten μm. Thus, the modulation frequency f becomes several ten MHz, which cannot be easily processed by a normal signal processing circuit. In order to decrease the value of the modulation frequency f, the present invention employs such an arrangement that, for example, two acousto-optic elements (17A, 17B) are positioned at a predetermined spacing and ultrasonic waves of slightly, mutually different frequencies $f_1$, $f_2$ are applied to these elements. This forms the ultrasonic acting regions (148A, 148B) at the predetermined spacing in the two acousto-optic elements.

Consequently, when a light beam $L_0$ of frequency $f_0$ from the light source means not shown is incident to a first acousto-optic element (17A), for example, nearly normally thereto, the light beam $L_0$ is subjected to the Raman-Nath diffraction at point P in the ultrasonic acting region (148A) inside the acousto-optic element (17A) to generate the zeroth-order light $L_A$ and the ±first-order diffracted light $L_0(1)$, $L_0(-1)$. The zeroth-order light $L_A$ is incident to a second acousto-optic element (17B) nearly normally thereto, and is subjected to diffraction at point Q in the ultrasonic acting region (148B) inside the acousto-optic element (17B) to generate the ±first-order diffracted light $L_A(1)$, $L_A(-1)$. Then the +first-order diffracted light $L_0(1)$ and $L_A(1)$ travels together as a light beam $L_1(1)$ in a same direction, and in symmetry therewith, the −first-order diffracted light $L_0(-1)$ and $L_A(-1)$ also travels as a beam $L_2(-1)$ in a same direction. A set of these two beams $L_1(1)$, $L_2(-1)$ are incident, for example, in symmetry to the diffraction grating mark, and interference light (heterodyne beam) of diffracted light emerging in a same direction from the diffraction grating mark is received. The interference light is a resultant of synthesis of the ±first-order diffracted light $L_0(1)$, $L_0(-1)$ and the ±first-order diffracted light $L_A(1)$, $L_A(-1)$.

In this case, the ±first-order diffracted light $L_0(1)$, $L_0(-1)$ is subjected to frequency modulation of $\pm f_1$ and the ±first-order diffracted light $L_A(1)$, $L_A(-1)$ is subjected to frequency modulation of $\pm f_2$. Let us define s as a spacing (air length) calculated as a distance in the air between point P in the first acousto-optic element (17A) and point Q in the second acousto-optic element (17B). Here, the air length is defined by d/n for a medium having the thickness d in the traveling direction of beam and the refractive index (relative refractive index) n. Using the spacing s expressed by the air length and letting θ be an angle of the +first-order diffracted light relative to the incidence direction, as shown in FIG. 21, the following optical path difference δ occurs between the +first-order diffracted light $L_0(1)$ and $L_A(1)$.

$$\delta = s - r \approx s \cdot \theta^2/2 \qquad (33)$$

Accordingly, the following phase difference ø appears between these two beams.

$$\phi \approx (s \cdot \theta^2/2) \cdot (2\pi/\lambda) \qquad (34)$$

Next, let us consider an optical beat signal obtained by photoelectric conversion of the interference light as a resultant of synthesis of the four beams comprised of the ±first-order diffracted light $L_0(1)$, $L_0(-1)$ and the ±first-order diffracted light $L_A(1)$, $L_A(-1)$. Supposing those four beams have an equal amplitude (denoted by A), light intensity I (t) of the resultant interference light is expressed by the following equation.

$$I(t) = [A \cos(\omega_1 \cdot t) + A \cos(\omega_2 \cdot t + \phi) + A \cos(\omega_3 \cdot t) + A \cos(\omega_4 \cdot t + \phi)]^2 \qquad (35)$$

In the above equation, t is the time, and each variable is defined as follows.

$$\omega_1 = 2\pi \cdot (f_0 + f_1), \; \omega_2 = 2\pi \cdot (f_0 - f_2), \; \omega_3 = 2\pi \cdot (f_0 - f_1), \; \omega_4 = 2\pi \cdot (f_0 + f_2).$$

Arranging Eq. (35) yields the below equation. In the following equation, functions $g_1(f_1, t)$, $g_2(f_2, t)$, $g_3(f_1, f_2, t)$ each are predetermined functions including the frequency $f_1$, the frequency $f_2$, and cosines of the frequencies $f_1$, $f_2$.

$$I(t)/A^2 = 2 + \cos 4\pi f_1 t + \cos 4\pi f_2 t + \qquad (36)$$
$$2\cos\phi[\cos\{2\pi(f_1 + f_2)t\} + \cos\{2\pi(f_1 - f_2)t\}] +$$
$$(\cos 4\pi f_0 t)g_1(f_1,t) + \{\cos(4\pi f_0 t + 2\phi)\}g_2(f_2,t) +$$
$$2\{\cos(4\pi f_0 t + \phi)\}g_3(f_1,f_2,t)$$

In this case, the frequency $f_0$ is the frequency ($10^{14}$ or more Hz) of the light incident, which cannot be detected by a normal photoelectric detector. Therefore, terms including the frequency $f_0$ vanish by time average. Hence, detectable light intensity I (t) in Eq. (36) is given as follows.

$$I(t)/A^2 = 2 + \cos 4\pi f_1 t + \cos 4\pi f_2 t + 2 \cos \phi[\cos\{2\pi(f_1+f_2)t\} + \cos\{2\pi(f_1-f_2)t\}] \qquad (37)$$

This light intensity I (t) of Eq. (37) is a signal in which a high-frequency component is superimposed on a low-frequency signal, as shown by curve 8 in FIG. 6.

Further, because in the case of the normal acousto-optic element the modulation frequencies $f_1$, $f_2$ are also high frequencies of $10^7$ or more Hz, they are frequencies to which the normal photoelectric detector cannot respond. In order to vanish components including the frequency $f_1$, the frequency $f_2$, and the frequency ($f_1+f_2$) more perfectly, a low-pass filter circuit is employed to eliminate the components with frequencies over ($f_1-f_2$). As a result, the light intensity I (t) of the interference fringes detected by the photoelectric detector becomes as described below. In other words, the optical beat signal beaten down to the frequency ($f_1-f_2$) easy to detect can be obtained by mixing the diffracted light from the two adjacent acousto-optic elements.

$$I(t) = 2 \cdot 2^0[1 + (\cos \phi) \cos\{2\pi(f_1-f_2)t\}] \qquad (38)$$

Curve 9 in FIG. 22 shows a waveform of the light intensity I (t) finally detected in this manner where the phase difference ø is 0.3 π. As seen from this Eq. (38), the beat frequency of the light intensity I (t) detected is $(f_1-f_2)$ and the contrast of signal is determined by cos ø. This means that the signal contrast becomes maximum when the phase difference ø is $m^\pi$ (where m is an integer) while the signal contrast becomes 0 when the phase difference ø is $(m+\frac{1}{2})^\pi$. Usually, if the signal contrast (cos ø) is at least ½, the optical beat signal can be normally detected. Thus, the condition for normally detecting the optical beat signal is given by above Eq. (28).

Expressing Eq. (28) with Eq. (34), the following equation is obtained.

$$(m-\tfrac{1}{3})\lambda/\theta^2 < s < (m+\tfrac{1}{3})\lambda/\theta^2 \qquad (39)$$

A diffraction angle θ of diffracted light is expressed as follows, using the wavelength λ of light and the wavelength Λ of the ultrasonic wave traveling inside the acousto-optic element.

$$\theta = \lambda/\Lambda \qquad (40)$$

Substituting this Eq. (40) into Eq. (39), above Eq. (29) is attained. For the acousto-optic element, the sound velocity v of the ultrasonic wave traveling inside is expressed by v=f·Λ, using the frequency f of ultrasonic wave and the wavelength Λ of ultrasonic wave. Accordingly, the wavelength of the ultrasonic wave is given as follows.

$$\Lambda = v/f \qquad (41)$$

Substituting this Eq. (41) into Eq. (29), Eq. (30) is attained.

The present invention can also be applied to cases where incident light beams are subjected to the Bragg diffraction (acoustic Bragg diffraction) by a plurality of acousto-optic elements (17A, 17B), for example as shown in FIG. 14. Also in this case, if the condition of Eq. (28) is satisfied as to the phase difference ø of diffracted light from adjacent acousto-optic elements, the contrast of the optical beat signal obtained becomes at least ½, which facilitates position detection.

In order to maximize the contrast of the optical beat signal obtained in the present invention, it is necessary to set the phase difference ø of the diffracted light from adjacent acousto-optic elements to 0, as described above, but to realize it is difficult where two acousto-optic elements are arranged in series. In contrast with it, when the relay optical system (154A, 154B) is disposed between the two acousto-optic elements (17A', 17B), as shown in FIG. 25, these two acousto-optic elements can be located at the positions conjugate with each other. This maximizes the contrast of the optical beat signal.

Since an effective area is only overlapping portions of the diffracted light from the adjacent acousto-optic elements, the SN ratio of the optical beat signal obtained can be improved by removing beams other than the overlapping portions by the field stop (157).

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

The first embodiment according to the position detecting apparatus according to the present invention will be described by reference to FIG. 1 to FIG. 14. The present embodiment is an example in which the present invention is applied to an alignment system in a projection exposure apparatus and in which the acoustic Bragg diffraction is utilized.

Figure 1:
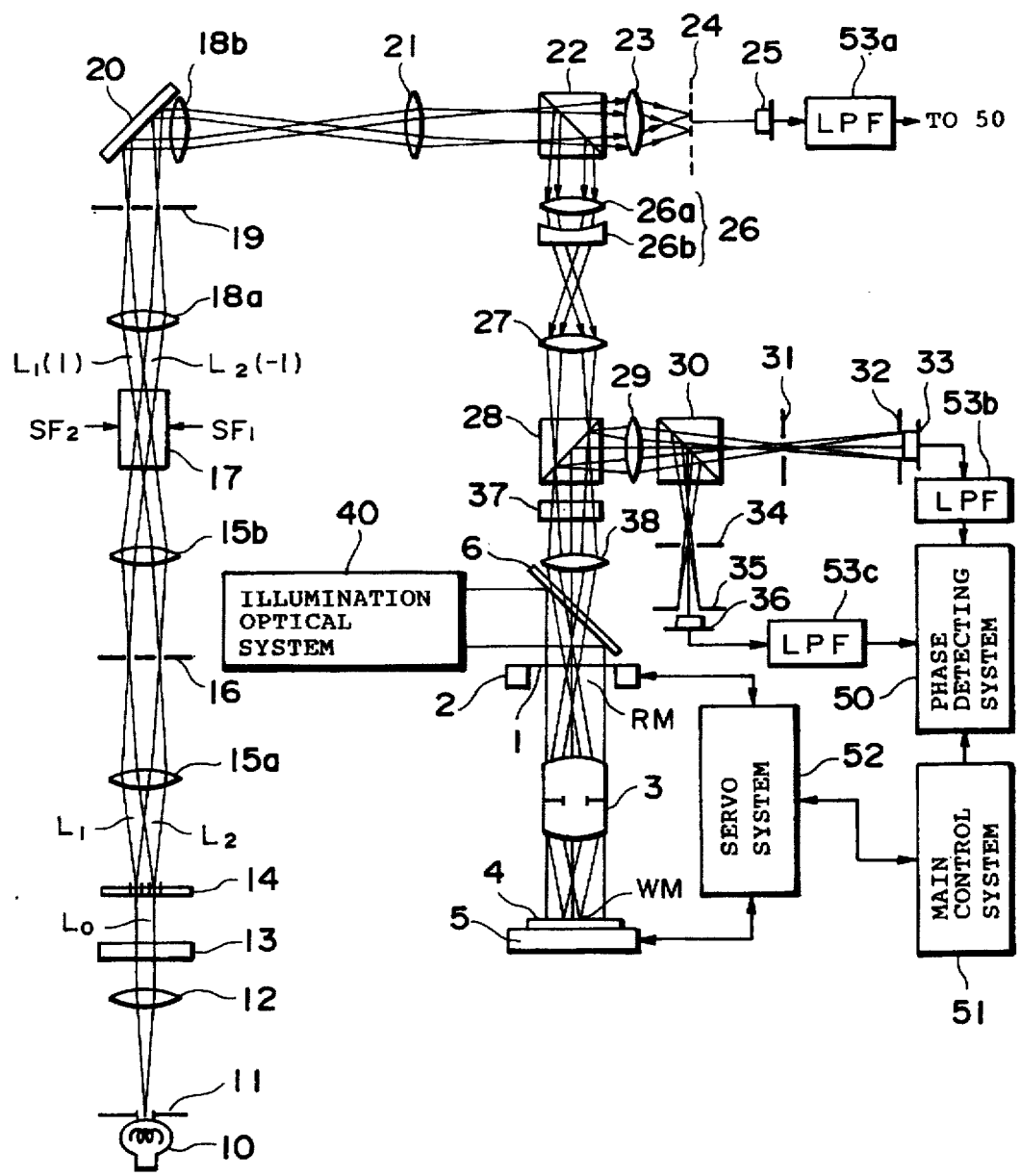
FIG. 1 is a structural drawing to show a schematic structure of a projection exposure apparatus as a first embodiment according to the present invention.

FIG. 1 shows a projection exposure apparatus of the present embodiment. In FIG. 1, a reticle 1 has a predetermined circuit pattern and a diffraction grating mark RM for alignment disposed in a peripheral portion around the pattern, and the reticle 1 is held on a two-dimensionally movable reticle stage 2. The reticle 1 is placed so as to be conjugate with a wafer 4 with respect to a projection optical system (projection objective lens) 3.

Exposure light from an illumination optical system 40 is reflected downward by a dichroic mirror 6 obliquely set at a slant angle of 45° relative to the optical axis above the reticle, to illuminate the reticle 1 with uniform illuminance. Under the exposure light, the pattern on the reticle is transferred onto the wafer 4 by the projection optical system 3. A diffraction grating mark WM for alignment, similar to the diffraction grating mark RM formed on the reticle 1, is formed on the wafer 4.

The wafer 4 is held on a wafer stage 5 which two-dimensionally moves in the step-and-repeat method, and the wafer 4 is stepped to a next shot position after completion of transfer of reticle pattern in a shot area on the wafer. Interferometers, not shown, for independently detecting x-directional, y-directional, and rotational ($\theta$-directional) positions on the reticle stage 2 or on the wafer stage 5 are provided for each stage, and drive of each stage in each direction is carried out by an unrepresented drive motor.

Further, an alignment optical system for detecting positions of the diffraction grating marks RM and WM is set above the dichroic mirror 6. Now, the alignment optical system is described.

White light from a white light source 10 such as a Xe lamp or halogen lamp for supplying light in a wavelength band different from that of the exposure light is converted into a parallel beam $L_0$ through an aperture-variable aperture stop 11 and a condenser lens 12, and thereafter the parallel beam passes a band-pass filter 13 for extracting light in a predetermined wavelength region to enter a diffraction grating 14 normally thereto. The parallel beam $L_0$ incident normally to the diffraction grating 14 is split into ±first order diffracted light $L_1$, $L_2$ with the predetermined wavelength region by the diffraction function of the diffraction grating 14.

Here, the ±first order diffracted light beams (hereinafter called simply as "light beams") $L_1$, $L_2$ having the predetermined wavelength region are condensed by a relay optical system 15 having lenses 15a and 15b, and thereafter the beams are incident in symmetry at equal incident angles to an acousto-optic modulator (hereinafter referred to as "AOM") 17. Provided between the lens 15a and the lens 15b is a spatial filter 16 for extracting ±first order diffracted light from the diffraction grating 14.

AOM 17 is driven in opposite directions by high frequency signals $SF_1$ and $SF_2$ of respective frequencies $f_1$ and $f_2$ (where $f_1 > f_2$), and the light beams $L_1$ and $L_2$ in the predetermined wavelength region are subjected to the acoustic Bragg diffraction by AOM 17. In the following description, the orders of diffracted light are taken with respect to the reference of a traveling direction of a progressive wave by the high frequency signal $SF_1$.

Here, letting the frequency (center frequency) of the beams $L_1$ and $L_2$ in the predetermined wavelength region be $f_0$, +first order diffracted light $L_1$ (1) of the light beam $L_1$ in the predetermined wavelength region (hereinafter referred to as "light beam $L_1$ (1)") is subjected to frequency modulation of ($f_0 + f_3$) (where $f_3 = (f_1 - f_2)/2$) by AOM 17, while −first order diffracted light $L_2$ (−1) of the light beam $L_2$ in the predetermined wavelength region (hereinafter referred to as "light beam $L_2$ (−1)") is subjected to frequency modulation of ($f_0 - f_3$) by AOM 17.

After that, the light beam $L_1$ (1) and light beam $L_2$ (−1) travel via lens 18a, reflective mirror 20, lens 18b, and lens 21, and then each beam is split into two light beams by a beam splitter 22. A spatial filter 19 for extracting the light beam $L_1$ (1) and light beam $L_2$ (−1) is disposed in the relay optical system constructed of the lens 18a and lens 18b.

The light beam $L_1$ (1) and light beam $L_2$ (−1) having passed through the beam splitter 22 are focused by a lens 23, and interference fringes flowing along the pitch direction are formed on a reference diffraction grating 24 located at the focus position. Then diffracted light through the diffraction grating 24 is photoelectrically detected as an optical beat signal for reference by a photoelectric detector 25. Since a signal output from the photoelectric detector 25 includes high frequency components of about the frequency $f_1$ as well as the optical beat signal expected, as seen from Formula (6), the high frequency components are eliminated by a low pass filter circuit (LPF) 53a for letting only signals of below about a frequency $f_1/2$ pass. Then only the optical beat signal is supplied to a phase detecting system 50.

On the other hand, the light beam $L_1$ (1) and light beam $L_2$ (−1) reflected by the beam splitter 22 pass through a relay optical system 26a, 26b, 27, a beam splitter 28, and a plane-parallel plate 37. The plane-parallel plate 37 is set at or near a position conjugate with the pupil of projection optical system 3 so as to be inclinable relative to the optical axis of alignment optical system, and has a function to maintain telecentricity. The plane-parallel plate 37 may be replaced by a combination of a thick plane-parallel plate for coarse adjustment with a thin plane-parallel plate for fine adjustment.

The light beam $L_1$ (1) and light beam $L_2$ (−1) having passed through the plane-parallel plate 37 are guided through an objective lens 38 and the dichroic mirror 6 to illuminate the diffraction grating mark RM on the reticle 1 in two directions with a predetermined cross angle.

If the projection optical system 3 is not corrected for chromatic aberration for the alignment light, the objective lens 38 should be preferably constructed of a bifocal optical system as proposed in Japanese Laid-open Patent Application No. 63-283129. In this arrangement, each of the two beams incident into the bifocal optical system is split into polarized light beams perpendicular to each other, beams of one polarized light traveling toward a first focal point are focused on the reticle 1, and beams of the other polarized light traveling toward a second focal point are focused on the wafer 4.

Figure 2:
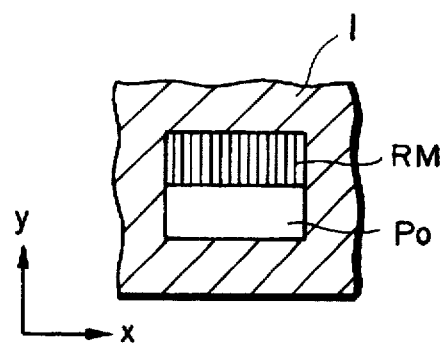
FIGS. 2 and 3 are enlarged plan views to show respective diffraction grating marks.
Figure 3:
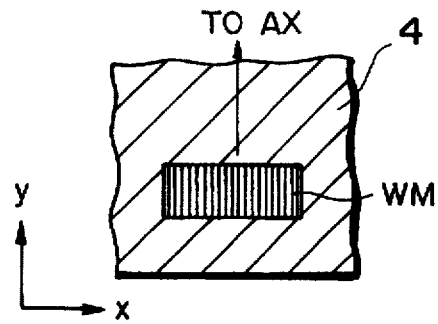

Now, the light beam $L_1$ (1) and light beam $L_2$ (−1) illuminate the diffraction grating mark RM on the reticle 1. The reticle 1 is provided with an alignment light transmitting window $P_0$ in parallel with the diffraction grating mark RM, as shown in FIG. 2, and the diffraction grating mark WM is formed at a position on the wafer 4 corresponding to the transmitting window $P_0$, as shown in FIG. 3.

The light beam $L_1$ (1) and light beam $L_2$ (−1) illuminate the diffraction grating mark RM and transmitting window $P_0$ in two directions so as to cover them, whereby interference fringes flowing along the pitch direction appear on the diffraction grating mark RM. Then +first order diffracted light of the light beam $L_1$ (1) and −first order diffracted light of the light beam $L_2$ (−1) is emergent in the direction of a normal line to the diffraction grating mark RM (or in the direction of the optical axis of projection optical system 3).

Here, the cross angle, at which the light beam $L_1$ (1) and light beam $L_2$ (−1) illuminate the diffraction grating mark RM in the two directions, is determined so as to satisfy the following relation of Formula (10) when the pitch of the diffraction grating mark RM is $P_{RM}$, the reference wavelength of the light supplied from the light source 10 is $\lambda_0$, and the incident angle of the light beam $L_1$ (1) or light beam $L_2$ (−1) onto the diffraction grating mark RM is $\theta_{RM}$.

$$\sin \theta_{RM} = \lambda_0 / P_{RM} \quad (10)$$

By this arrangement, the ±first order diffracted light emerging from the diffraction grating mark RM is guided again through the dichroic mirror 6, the objective lens 38, and the plane-parallel plate 37, thereafter is reflected by the beam splitter 28, and then is guided through a lens 29 and via a beam splitter 30 to reach a field stop 34.

Figure 4:
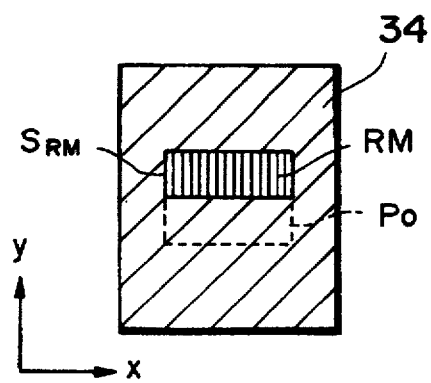
FIGS. 4 and 5 are enlarged plan views to show respective field stops provided in an alignment optical system.

The field stop 34 is located at a position conjugate with the reticle 1, and specifically, is provided with an opening portion $S_{RM}$ corresponding to the position of the diffraction grating mark RM so as to let only diffracted light from the diffraction grating mark RM on the reticle 1 pass therethrough, as shown by the hatched lines in FIG. 4.

Then, the diffracted light from the diffraction grating mark RM having passed the field stop 34 is filtered by a spatial filter 35 for cutting the zeroth order diffracted light, so that only ±first order diffracted light reaches a photoelectric detector 36. The photoelectric detector 36 photoelectrically detects an optical beat signal including position information of the reticle 1. A signal output from the photoelectric detector 36 is also guided through a low pass filter circuit (LPF) 53c for letting signals of frequencies below about $f_1/2$ pass, and is supplied to the phase detecting system 50.

On the other hand, part of the light beam $L_1$ (1) and light beam $L_2$ (−1) having passed the transmitting window $P_0$ in the reticle 1 is guided through the projection optical system 3 to illuminate the diffraction grating mark WM on the wafer 4 in two directions with a predetermined cross angle, whereby interference fringes flowing along the pitch direction appear on the diffraction grating mark WM. Then −first order diffracted light of the light beam $L_1$ (1) and +first order diffracted light of the light beam $L_2$ (−1) appears in the direction of a normal line to the diffraction grating mark WM.

Here, the cross angle, at which the light beam $L_1$ (1) and light beam $L_2$ (−1) illuminate the diffraction grating mark RM in the two directions, is determined so as to satisfy the relation of Formula (11) when the pitch of the diffraction grating mark WM is $P_{WM}$, the reference wavelength of the light supplied from the light source 10 is $\lambda_0$, and the incident angle of the light beam $L_1$ (1) or light beam $L_2$ (−1) onto the diffraction grating mark WM is $\theta_{WM}$.

$$\sin \theta_{WM} = \lambda_0 / P_{WM} \quad (11)$$

By this arrangement, the ±first order diffracted light emerging from the diffraction grating mark WM is guided again through the projection optical system 3, the transmitting window $P_0$, the dichroic mirror 6, the objective lens 38, and the plane-parallel plate 37, thereafter is reflected by the beam splitter 28, and then is guided through the lens 29 and the beam splitter 30 to reach a field stop 31.

Figure 5:
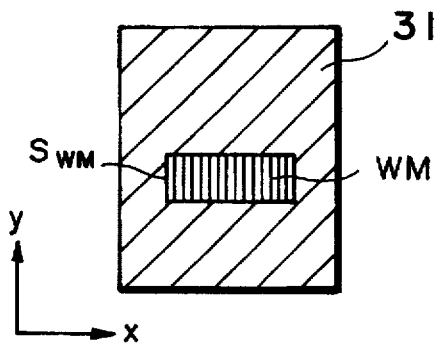

This field stop 31 is located at a position conjugate with the wafer 4, and specifically, is provided with an opening portion $S_{WM}$ corresponding to the position of the diffraction grating mark WM so as to let only diffracted light from the diffraction grating mark WM on the wafer 4 pass therethrough, as shown by the hatched lines in FIG. 5.

Then, the diffracted light from the diffraction grating mark WM having passed the field stop 31 is filtered by a spatial filter 32 for cutting the zeroth order diffracted light, so that only ±first order diffracted light reaches a photoelectric detector 33. This photoelectric detector 33 photoelectrically detects an optical beat signal including position information of the wafer 4. A signal output from the photoelectric detector 36 is also let to pass a low pass filter circuit (LPF) 53b for letting signals of frequencies below about $f_1/2$ pass, and is then supplied to the phase detecting system 50.

Here, the each spatial filter 32, 35 is located at the position nearly conjugate with the pupil of the alignment optical system, i.e., at the position substantially conjugate with the pupil (exit pupil) of the projection optical system 3, and is so arranged that it can interrupt the zeroth order diffracted light (regularly reflected light) from the diffraction grating mark RM or WM formed on the reticle 1 or on the wafer 4 but transmits only ±first order diffracted light (diffracted light emerging in the direction normal to the diffraction grating mark on the reticle 1 or wafer 4). Also, the photoelectric detectors 33 and 36 are arranged so as to be nearly conjugate with the reticle 1 and the wafer 4, respectively, with respect to the objective lens 38 and the lens 29.

Now, according to the structure of the alignment optical system as described above, three signals obtained through the respective low pass filter circuits 53a, 53b, 53c from the individual photoelectric detectors 25, 33, 36, each signal including a sinusoidal beat signal of frequency $\Delta f$ (=$2f_3$= $f_1-f_2$), and a beat signal extracting portion (Fourier transform circuit) in the phase difference detecting system 50 accurately extracts the sinusoidal beat signals of frequency $\Delta f$ from the three photoelectric signals.

Supposing the reticle 1 and wafer 4 are stopped at respective, arbitrary positions in a non-aligned state, the optical beat signals will deviate from each other by a constant phase. Here, a phase difference (±180°) between the optical beat signals from the reticle 1 and the wafer 4 uniquely corresponds to an amount of relative positional deviation of within a half of the grating pitch of the diffraction grating marks formed on the reticle 1 and wafer 4, respectively.

Thus, with relative movement of the reticle 1 to the wafer 4, pre-alignment is made with such an accuracy that an amount of relative positional deviation becomes smaller than a half of the grating pitch of the each diffraction grating mark RM, WM. A main control system 51 makes a servo system 52 two-dimensionally move the reticle stage 2 or wafer stage 5 so that the phase difference obtained by the phase difference detecting system 50 becomes 0 or a specific value, thus positioning them. This effects high-accuracy positioning.

In another arrangement, using the optical beat signal for reference obtained by the photoelectric detector 25 as a reference signal, positioning may be made so that phase differences between the reference signal and the beat signals from the respective diffraction grating marks RM, WM become zero or a specific value. Also, a drive signal for driving AOM 17 may be used as a reference signal.

Figure 6:
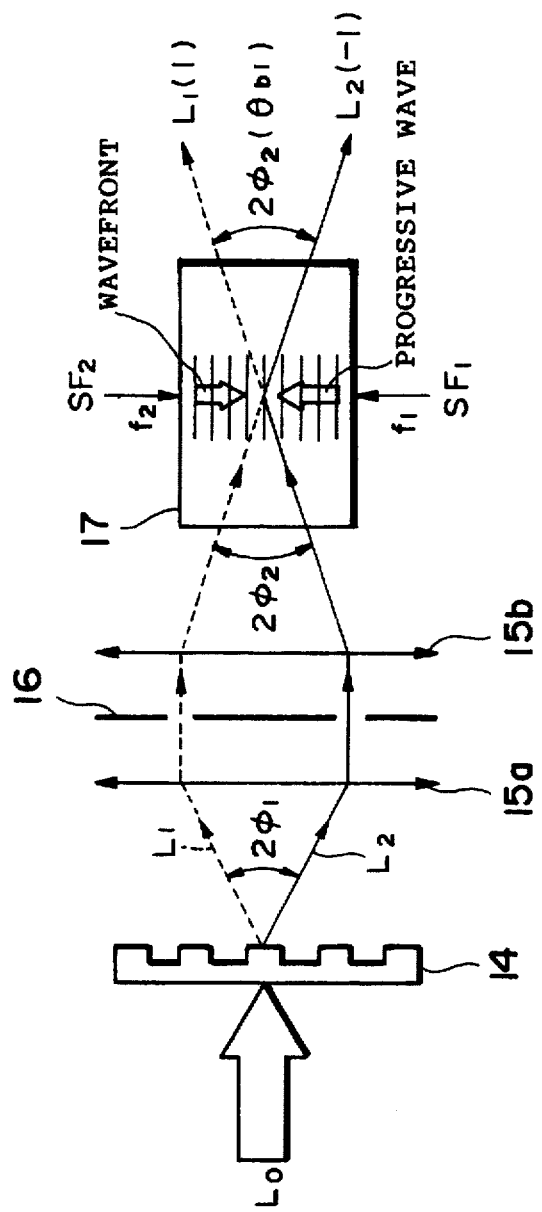
FIG. 6 is a drawing to show a structure of a two-beam making portion (which is a portion for making two light beams of mutually different frequencies) in Embodiment 1.

Next described referring to FIG. 6 are specific structure and theory as to the portion for making the two light beams of mutually different frequencies in The first embodiment shown in FIG. 1.

As shown in FIG. 6, when the light beam $L_0$ of white light is incident normally to the diffraction grating 14, diffracted light of individual orders appears for each wavelength by the diffracting function of the diffraction grating 14.

On this occasion, diffracted light of individual orders satisfying the following Formula (12) appears when $\phi_1$ is an angle of diffraction of diffracted light with respect to the normal line to the diffraction grating 14, $P_G$ is the pitch of the diffraction grating 14, $\lambda$ is the wavelength of light, and N (integer) is the order of diffracted light.

$$\sin \phi_1 = N\lambda/P_G \tag{12}$$

Then the diffracted light of individual orders in the predetermined wavelength band, having passed through the condenser lens 15a, is filtered by the spatial filter 16 placed at the rear focal point of condenser lens 15a (or at the front focal point of condenser lens 15b), so that the light other than the ±first order diffracted light in the predetermined wavelength band is interrupted and only the ±first order diffracted light $L_1$, $L_2$ in the predetermined wavelength band is selected to travel through the condenser lens 15b toward AOM 17.

Here, let us consider an angle of diffraction of the ±first order diffracted light $L_1$, $L_2$ passing through the spatial filter 16. For example, assuming that the reference wavelength $\lambda_0$ of illumination light $L_0$ is 633 nm, that the wavelength band of the light beam $L_0$ is ($\lambda_0 \pm \Delta\lambda$) (where $\Delta\lambda$ is 20 nm), and that the pitch of the diffraction grating 14 is 4 µm, the angle of diffraction of the ±first order diffracted light for the shortest wavelength of 613 nm is 8.82° from Formula (12), while the angle of diffraction of the ±first order diffracted light for the longest wavelength of 653 nm is 9.40° from Formula (12).

Accordingly, the ±first order diffracted light with diffraction angles in the range of 8.82° to 9.40° is generated from the light in the wavelength band of 613 nm to 653 nm.

As described, the diffraction angle $\phi_1$ changes with a change of the wavelength of light. Since the present embodiment is arranged as shown in FIG. 6, that is, in such a manner that a point of diffraction of the diffraction grating 14 is relayed by the relay optical system 15a, 15b into the ultrasonic traveling path of AOM 17 whereby the ±first order diffracted light of the respective wavelengths is focused inside AOM 17, the ±first order diffracted light $L_1$, $L_2$ in the predetermined wavelength band, split in symmetry by the diffraction grating 14, is incident in symmetry to AOM 17 under an incident angle $\phi_2$ preliminarily determined for each wavelength.

This will be explained with equations. First, the ±first order diffracted light $L_1$, $L_2$ in the predetermined wavelength region is incident at incident angle $\phi_2$ in two directions into AOM 17, and is subjected to the acoustic Bragg diffraction by AOM 17.

The AOM 17 is driven by the high frequency signal $SF_1$ of frequency $f_1$ and the high frequency signal $SF_2$ of frequency $f_2$ close to the frequency $f_1$ whereby a diffraction angle of +first order diffracted light $L_1$ (1) of the first order diffracted light $L_1$ in the predetermined wavelength region and a diffraction angle of −first order diffracted light $L_2$ (−1) of the −first order diffracted light $L_2$ in the predetermined wavelength region both become $2\phi_2$ (the double of the incident angle $\phi_2$).

Now, the following relations of Formula (13) and Formula (14) hold as to a wavelength $\Lambda$ of a synthesized ultrasonic wave (progressive wave) traveling across inside AOM 17, and a diffraction angle $\theta_{b1}$, where $\theta_{b1}$ (=$2\phi_2$) is a diffraction angle by the Bragg diffraction of AOM 17, v is the speed of the synthesized ultrasonic wave (progressive wave) traveling across in AOM 17, $f_1$, $f_2$ are the frequencies of high frequency signals $SF_1$, $SF_2$, and $\lambda$ is the wavelength of light.

$$\Lambda = v/f(f=(f_1+f_2)/2) \tag{13}$$

$$\sin \theta_{b1} = \lambda/\Lambda \tag{14}$$

Therefore, from Formula (13) and Formula (14), the diffraction angle $\theta_{b1}(=2\phi_2)$ by AOM 17 finally becomes as expressed by the following formula.

$$\sin \theta_{b1} = f\lambda/v \text{ (or, } \sin 2\phi_2 = f\lambda/v) \tag{15}$$

Accordingly, the +first order diffracted light $L_1$ (1) in the predetermined wavelength region and the −first order diffracted light $L_2$ (−1) in the predetermined wavelength region is emergent at diffraction angles satisfying Formula (15) for every wavelength from AOM 17.

When a magnification of the relay optical system 15a, 15b is $\beta_1$ and if the relay optical system 15a, 15b satisfies the sine condition, the following relation holds.

$$\beta_1 = \sin \phi_1/\sin \phi_2 = 2 \sin \phi_1/\sin (2\phi_2) \tag{16}$$

From Formula (12), Formula (15), and Formula (16), the following Formula (17) is derived.

$$\beta = (2v)/(P_G f) \tag{17}$$

Therefore, the relay optical system 15a, 15b should be preferably constructed so as to satisfy the above Formula (17).

Returning to FIG. 1, in the present embodiment, the +first order diffracted light (light beam) $L_1$ (1) of frequency $F_1$ having the predetermined wavelength region and the −first order diffracted light (light beam) $L_2$ of frequency $F_2$ having the predetermined wavelength region can be irradiated in symmetry under incident angles different every light of each wavelength onto the each diffraction grating 24, RM, WM, so that the ±first order diffracted light of each wavelength can be always generated in the direction normal to the each diffraction grating 24, RM, WM. As a result, beat light including the predetermined frequency $\Delta f$ (=$|F_1-F_2|=|f_1-f_2|$) can be made from the ±first order diffracted light of each wavelength. Thus, multi-wavelength beat light including the predetermined frequency $\Delta f$ ($=|F_1-F_2|=|f_1-f_2|$) can be photoelectrically detected by the each photoelectric detector 25, 33, 36 (i.e., a plurality of beat light including position information of each diffraction grating can be detected for the respective wavelengths. As a result, suppressing the influence of asymmetry of each diffraction grating mark by an averaging effect of the beat light of the wavelengths, the arrangement can overcome the influence of thin-film interference in the photoresist layer by multi-wavelength light (the influence such as a change of light quantity), thereby achieving high-accuracy alignment by the heterodyne interference technique.

In addition, because the white light (multi-wavelength light) split in symmetry with respect to the incident direction (the direction of the optical axis) by the diffraction grating 14 (beam splitting means) travels in symmetry and in parallel in the relay optical system 15a, 15b and AOM 17, no optical path difference is theoretically present between the split beams. Since this aligns wavefronts between the split beams in a state of phase difference of 0, high-accuracy alignment becomes possible and the compact apparatus easy in adjustment can be achieved.

Incidentally, The first embodiment utilizes the ±first order diffracted light $L_1$ (1), $L_2$ (-1) emergent in symmetry from AOM 17 after optical modulation, as light beams for alignment, extracts the signal of beat light of the predetermined frequency $\Delta f$ ($=|f_1-f_2|$), appearing when the ±first order diffracted light $L_1$ (1), $L_2$ (-1) is applied in two directions to each diffraction grating 24, RM, WM, through the each photoelectric detector 25, 33, 36 and the optical beat signal extracting portion (Fourier transform circuit) in the phase difference detecting system 50, and uses the thus extracted signal for alignment, the reason of which is as follows.

Figure 8:
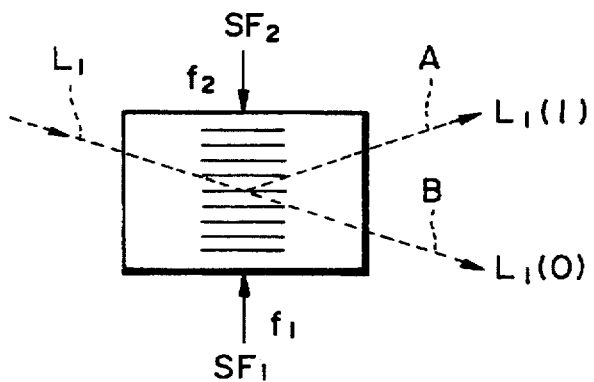
FIGS. 8 and 9 are drawings to show a state in which an acousto-optic modulator in the first embodiment generates noise light.
Figure 9:
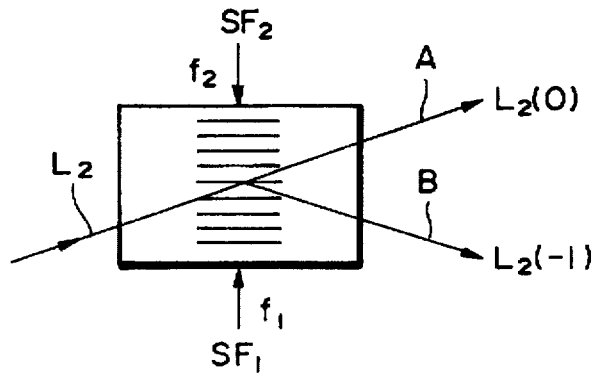

In the present embodiment, as shown in FIGS. 8 and 9, the zeroth order diffracted light $L_2$ (0) of the light beam $L_2$ is mixed on an optical path A of the +first order diffracted light $L_1$ (1) by the optical modulation of AOM 17, and the zeroth order diffracted light $L_1$ (0) of the light beam $L_1$ is mixed on an optical path B of the -first order diffracted light $L_2$ (-1) by the optical modulation. On this occasion, the zeroth order diffracted light $L_1$ (0) of the light beam $L_1$ and the zeroth order diffracted light $L_2$ (0) of the light beam $L_2$ both are free of the frequency modulation at each wavelength, and each has the frequency $f_0$.

Thus, the optical path A includes a mixture of the first order diffracted light $L_1$ (1) of frequency ($f_0+f_3$) and the zeroth order diffracted light $L_2$ (0) of frequency $f_0$, while the optical path B includes a mixture of the -first order diffracted light $L_2$ (-1) of frequency ($f_0-f_3$) and the zeroth order diffracted light $L_1$ (0) of frequency $f_0$. When these light beams are irradiated in two directions onto the each diffraction grating 24, RM, WM, beat light with various beat frequencies appears in the direction normal to the each diffraction grating 24, RM, WM. If alignment were carried out based on a signal obtained simply by photoelectrically converting the beat light with various beat frequencies by each photoelectric detector 25, 33, 36, signals of various beat frequencies would become noise signals, which would negatively affect the detection accuracy and which could result in incapability of alignment.

Thus, first discussed is the beat light with various beat frequencies generated by optical modulation of AOM 17.

The frequencies of the respective diffracted light are listed in order in the following.

In the optical path A, the frequency of the first order diffracted light $$L_1\ (1):\ f_0+f_3 \qquad (18)$$

the frequency of the zeroth order diffracted light $$L_2\ (0):\ f_0 \qquad (19)$$

Similarly, in the optical path B, the frequency of the -first order diffracted light $$L_2\ (-1):\ f_0-f_3 \qquad (20)$$

the frequency of the zeroth order diffracted light $$L_1\ (0):\ f_0 \qquad (21)$$

Thus, frequencies of beat light generated by combinations of the respective diffracted light traveling in the optical path A with the respective diffracted light traveling in the optical path B are as follows.

Namely, from an absolute value of a difference between Formula (18) and Formula (20), $$|(f_0+f_3)-(f_0-f_3)|=|2f_3| \qquad (22)$$

From an absolute value of a difference between Formula (18) and Formula (21), $$|(f_0+f_3)-f_0|=|f_3| \qquad (23)$$

From an absolute value of a difference between Formula (19) and Formula (20), $$|f_0-(f_0-f_3)|=|f_3| \qquad (24)$$

From an absolute value of a difference between Formula (18) and Formula (20), $$|f_0-f_0|=0 \qquad (25)$$

Thus, the beat light photoelectrically detected by each photoelectric detector 25, 33, 36 includes a mixture of three beat frequencies of Formula (22) to Formula (24). With combinations of diffracted light with Formula (25), it becomes a direct current component (DC component) when photoelectrically detected by each photoelectric detector 25, 33, 36. If it negatively affects the detection accuracy, it may be removed upon execution of Fourier transform in the optical beat signal extracting portion in the phase difference detecting system 50. Alternatively, the DC component may be removed by another electric filter means.

Since one that can be utilized as a beat frequency for alignment is one without a common beat frequency out of these beat frequencies, the present embodiment is arranged to extract a signal of only one beat frequency of $|f_1-f_2|$ ($=2f_3$), generated by a combination of the light beam $L_1$ (1) with the light beam $L_2$ (-1), by the optical beat signal extracting portion (Fourier transform circuit) in the phase difference detecting system 50.

By this, even if the beat light with various beat frequencies is photoelectrically detected by each photoelectric detector 25, 33, 36, high-accuracy alignment can be achieved by the heterodyne interference technique, based on the signal of the specific beat frequency ($|f_1-f_2|$) as extracted by the optical beat signal extracting portion (Fourier transform circuit).

Next described referring to FIG. 10 to FIG. 14 are a specific structure of AOM 17 used in the present embodiment, and structures of modifications.

Figure 10:
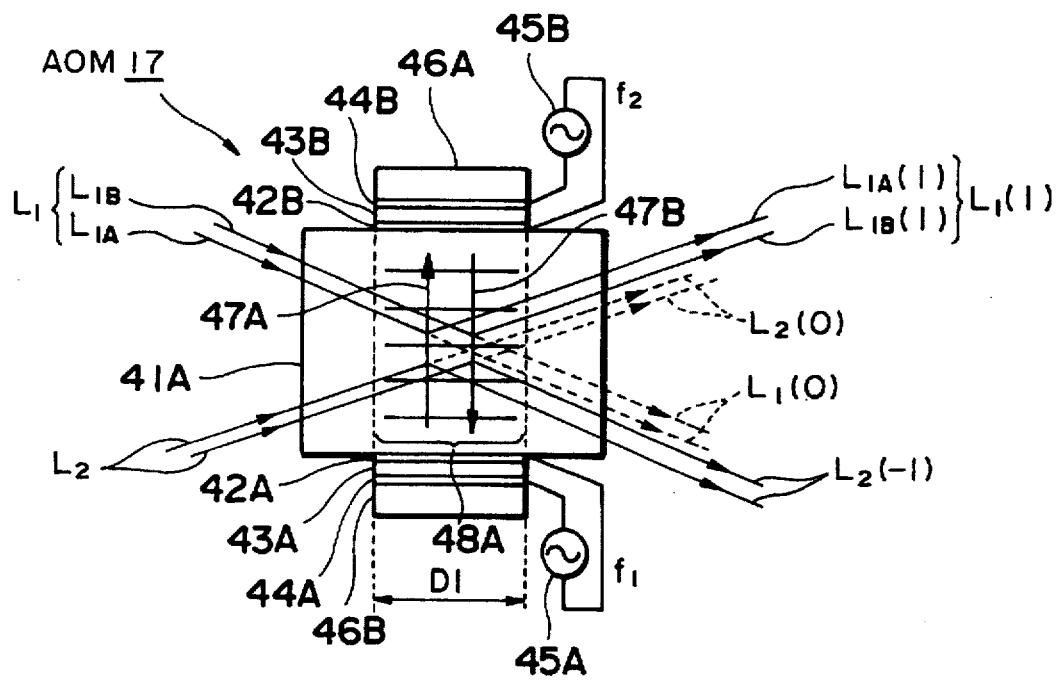
FIG. 10 is a structural drawing to show an acousto-optic modulator used in the first embodiment.

FIG. 10 shows the AOM 17 used in FIG. 1. In FIG. 10, fixed in order to one side surface of an acousto-optic medium 41A are an electrode plate 42A, a transducer 43A for generating an ultrasonic wave, an electrode plate 44A, and a sound absorbing member 46B; and a drive signal of frequency $f_1$ is supplied from a high-frequency power supply 45A to between the electrode plates 42A and 44A, thereby forming a progressive wave 47A. Fixed in order to the other side surface of the acousto-optic medium 41A are an electrode plate 42B, a transducer 43B for generating an ultrasonic wave, an electrode plate 44B, and a sound absorbing member 46A; and a drive signal of frequency $f_2$ is supplied from a high-frequency power supply 45B to between the electrode plates 42B and 44B, thereby forming a progressive wave 47B. The sound absorbing members 46A and 46B function to absorb the ultrasonic waves (progressive waves) from the opposed transducers 43A and 43B, respectively, so as to prevent generation of reflected waves.

In this case, specific examples of the acousto-optic medium 41A are a single crystal of tellurium dioxide (TeO$_2$), rock crystal, quartz, a single crystal of lead molybdate, etc. in addition to normal glasses. Also, the sound absorbing members 46A, 46B may be made of a material having an acoustic impedance close to that of the acousto-optic medium 41A and being ready to absorb sound waves. The acoustic impedance means a product between the density and the speed of sound. Specific examples of the sound absorbing members 46A, 46B are metal films, for example of lead or aluminum, etc. Specific examples of the transducers 43A, 43B are a single crystal of lithium niobate (LiNbO$_3$), a single crystal of LiIO$_3$, a single crystal of Ba$_3$NaNb$_5$O$_{15}$, etc.

A region between the transducers 43A and 43B forms an ultrasonic acting area 48A in a width D1. As seen from Formula (6), a progressive wave of frequency $f_3$ ($=(f_1-f_2)/2$) is formed in the ultrasonic acting area 48A. Thus, the light beam $L_1$ is actually diffracted by the progressive wave of frequency $f_3$ to become the +first order diffracted light (light beam) $L_1$ (1), but conceptually, the light beam $L_1$ (1) can be regarded as composed of mixed waves between the +first order diffracted light $L_{1A}$ (1) by the progressive wave 47A, of the light beam $L_{1A}$ in the light beam $L_1$ and the +first order diffracted light $L_{1B}$ (1) by the progressive wave 47B, of the light beam $L_{1B}$. Similarly, as for the light beam $L_2$ incident in symmetry with the light beam $L_1$, the −first order diffracted light by the progressive wave of frequency $f_3$ becomes the light beam $L_2$ (−1), but conceptually, the light beam $L_2$ (−1) can be regarded as composed of mixed waves between the −first order diffracted light by the progressive wave 47A in the light beam $L_2$ and the −first order diffracted light by the progressive wave 47B. The modulation frequency of the light beam $L_1$ (1) is $f_3$ and the modulation frequency of the light beam $L_2$ is $-f_3$. As an example, the drive frequency $f_1$ of one transducer is about 50 MHz, the drive frequency $f_2$ of another transducer is about (50 MHz+ some 10 kHz), and the beat frequency, 2·$f_3$, is some 10 kHz.

Further in this case, in order to prevent the zeroth order light $L_1$ (0) of the light beam $L_1$ from mixing in the light beam $L_2$ (−1) and to prevent the zeroth order light $L_2$ (0) of the light beam $L_2$ from mixing in the light beam $L_1$ (1), the traveling direction of the ultrasonic waves 47A, 47B are kept non-parallel to a plane expanded by the two light beams $L_1$, $L_2$ incident, whereby the zeroth order light $L_1$ (0) and $L_2$ (0) can be completely removed by the spatial filter 19 in FIG. 1.

Figure 11:
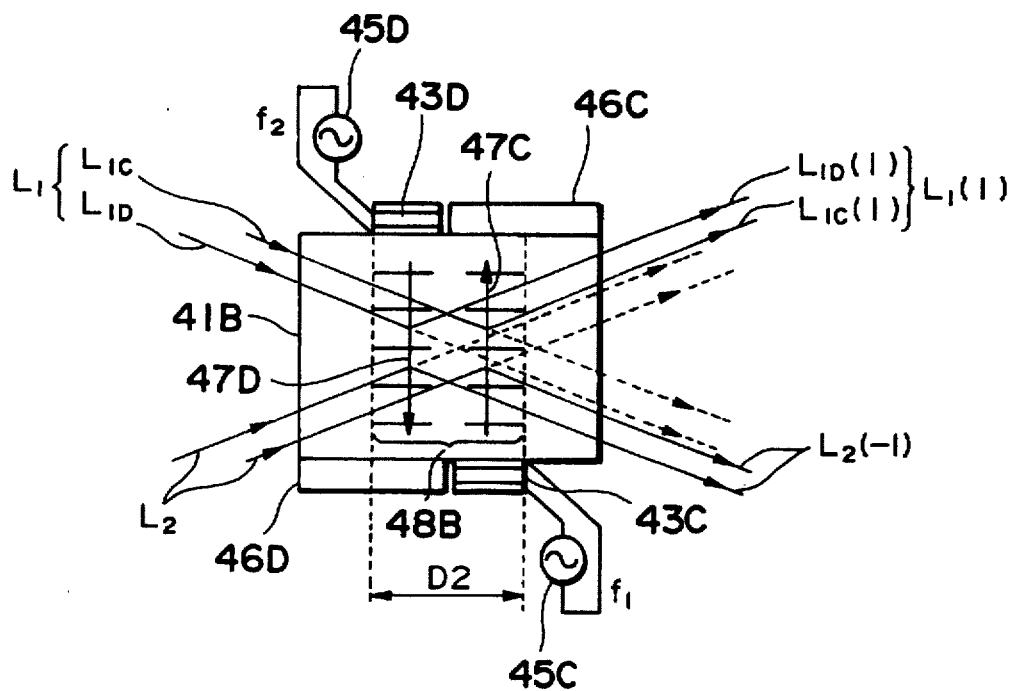
FIG. 11 is a structural drawing to show a first modification of the acousto-optic modulator.

Next, FIG. 11 shows a first modification of the acousto-optic modulator. In FIG. 11, a sound absorbing member 46D and a transducer 43C sandwiched between electrode plates are bonded to one side surface of an acousto-optic medium 41B; a transducer 43D sandwiched between electrode plates, and a sound absorbing member 46C are bonded to the other side surface of the acousto-optic medium 41B so as to be opposed to the sound absorbing member 46D and the transducer 43C, respectively; drive signals of frequencies $f_1$ and $f_2$ are supplied from high-frequency power supplies 45C and 45D to the transducers 43C and 43D, respectively. In this case, an ultrasonic acting area 48B of a common width D2 is formed by progressive waves 47C and 47D supplied in opposite directions and in parallel from the transducers 43C and 43D.

A synthetic progressive wave of frequency $f_3$ ($=(f_1-f_2)/2$) is formed in the ultrasonic acting area 48B. Thus, the light beam $L_1$ is actually diffracted by the progressive wave of frequency $f_3$ to become +first order diffracted light (light beam) $L_1$ (1), but conceptually, the light beam $L_1$ (1) can be regarded as composed of mixed waves between the +first order diffracted light $L_{1C}$ (1) by the progressive wave 47C, of the light beam $L_{1C}$ in the light beam $L_1$ and the +first order diffracted light $L_{1D}$ (−1) by the progressive wave 47D, of the light beam $L_{1D}$. Similarly, as for the light beam $L_2$ incident in symmetry with the light beam $L_1$, the −first order diffracted light by the progressive wave of frequency $f_3$ becomes the light beam $L_2$ (−1), but conceptually, the light beam $L_2$ (−1) can be regarded as composed of mixed waves between the −first order diffracted light by the progressive wave 47C in the light beam $L_2$ and the −first order diffracted light by the progressive wave 47D.

In the example of FIG. 11, the progressive waves 47C and 47D rarely overlap and the sound absorbing members 46C and 46D are opposed to the associated transducers 43C and 43D, whereby the preventing effect of generation of reflected waves becomes surer than by the example of FIG. 10.

Figure 12:
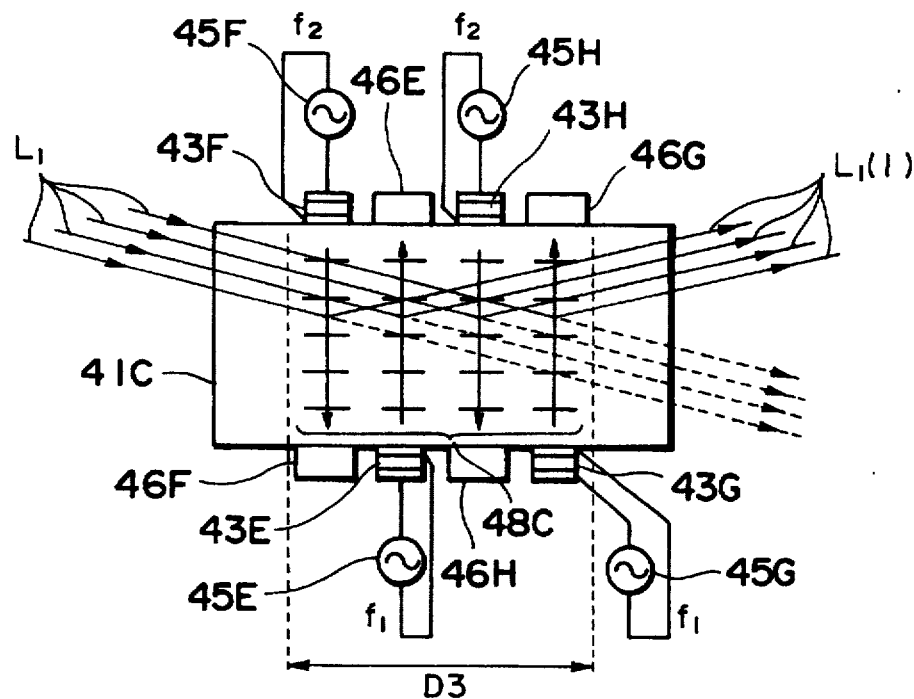
FIG. 12 is a structural drawing to show a second modification of the acousto-optic modulator.

Another arrangement may include three or more transducers for generating progressive waves traveling alternately in opposite directions as in the following modification. FIG. 12 shows a second modification of the acousto-optic modulator. In FIG. 12, bonded in order to one side surface of an acousto-optic medium 41C are a sound absorbing member 46F, a transducer 43E between electrode plates, a sound absorbing member 46H, and a transducer 43G between electrode plates; as opposed thereto, bonded in order to the other side surface of the acousto-optic medium 41B are a transducer 43F between electrode plates, a sound absorbing member 46E, a transducer 43H between electrode plates, and a sound absorbing member 46G. Drive signals of frequency $f_1$ are supplied from high-frequency power supplies 45E and 45G to the transducers 43E, 43G, respectively, and drive signals of frequency $f_2$ are supplied from high-frequency power supplies 45F and 45H to the transducers 43F and 43H, respectively. In this case, an ultrasonic acting area 48C of a common width D3 is formed by progressive waves supplied from the transducers 43E, 43G and progressive waves supplied in the opposite direction from the transducers 43F, 43H.

A synthetic progressive wave of frequency $f_3$ ($=(f_1-f_2)/2$) is formed in the ultrasonic acting area 48C. Thus, the light beam $L_1$ is actually diffracted by the progressive wave of frequency $f_3$ to become +first order diffracted light (light beam) $L_1$ (1), but conceptually, the light beam $L_1$ (1) can be regarded as composed of mixed waves between the +first order diffracted light by the progressive wave of frequency $f_1$, in the light source $L_1$ and the +first order diffracted light by the progressive wave of frequency $f_2$. This is the case also for the other light beam (not shown) incident in symmetry with the light beam $L_1$.

Figure 13:
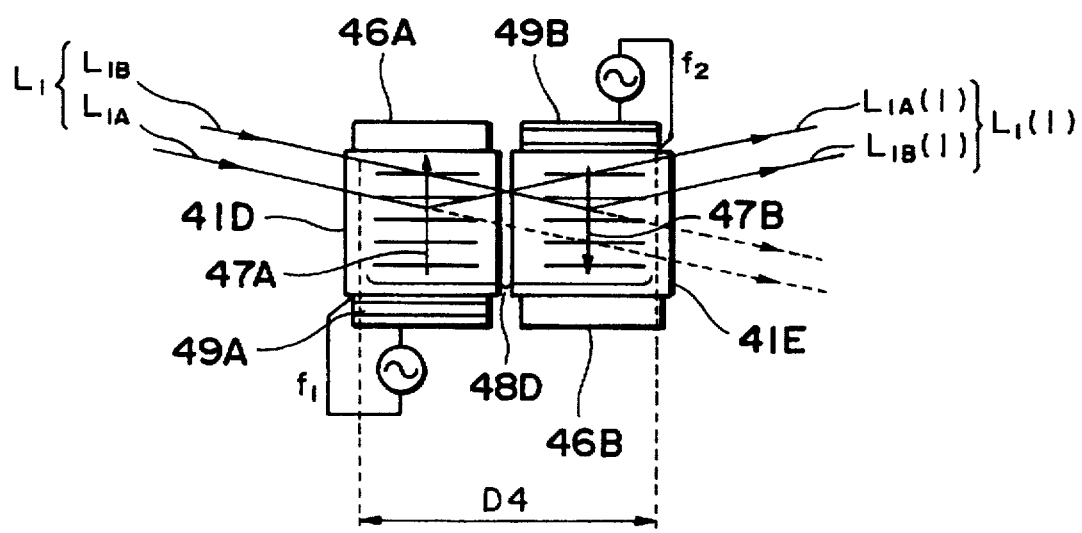
FIG. 13 is a structural drawing to show a third modification of the acousto-optic modulator.

Next, one ultrasonic acting area may range over a plurality of acousto-optic media as in the following modification. FIG. 13 shows a fourth modification of the acousto-optic modulator. In FIG. 13, a sound absorbing member 46A and a transducer 49A between electrode plates are fixed as opposed to each other on respective side surfaces of a first acousto-optic medium 41D, and a sound absorbing member 46B and a transducer 49B between electrode plates are fixed as opposed to each other on respective side surfaces of a second acousto-optic medium 41E. The transducer 49A and sound absorbing member 46B are disposed as adjacent to each other, and drive signals of frequencies $f_1$ and $f_2$ are supplied from high-frequency power supplies to the transducers 49A and 49B, respectively. In this case, an ultrasonic acting area 48D of a common width D4 is formed by a progressive wave 47A supplied from the transducer 49A in the first acousto-optic medium 41D and a progressive wave 47B supplied in the opposite direction from the transducer 49B in the second acousto-optic medium 41E.

A synthetic progressive wave substantially of frequency $f_3$ ($=(f_1-f_2)/2$) is formed in the ultrasonic acting area 48D. Thus, the light beam $L_1$ is actually diffracted by the progressive wave of frequency $f_3$ to become +first order diffracted light (light beam) $L_1$ (1), but conceptually, the light beam $L_1$ (1) can be regarded as composed of mixed waves between the +first order diffracted light $L_{1A}$ (1) by the progressive wave 47A, of the light beam $L_{1A}$ in the light beam $L_1$ and the +first order diffracted light $L_{1B}$ (1) by the progressive wave 47B, of the light beam $L_{1B}$. The same can be applicable to the other light beam (not shown) incident in symmetry with the light beam $L_1$.

Figure 14:
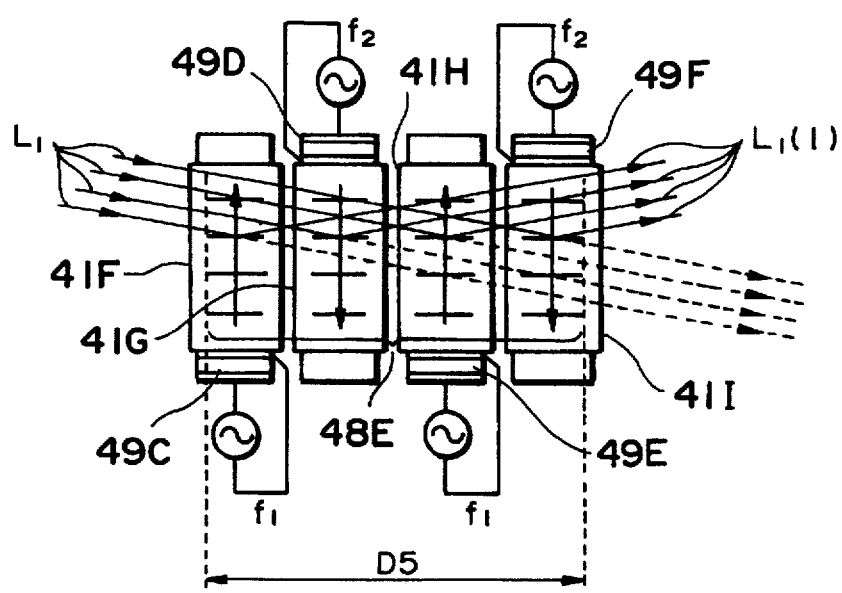
FIG. 14 is a structural drawing to show a fourth modification of the acousto-optic modulator.

Another arrangement may include three or more acousto-optic media for forming progressive waves traveling alternately in opposite directions to each other as in the following modification. FIG. 14 shows a fourth modification of the acousto-optic modulator. In FIG. 14, a progressive wave of frequency $f_1$ is supplied from a transducer 49C to an acousto-optic medium 41F; a progressive wave of frequency $f_2$ traveling in the opposite direction thereto is supplied from a transducer 49D to a next acousto-optic medium 41G adjacent to it; a progressive wave of frequency $f_1$ traveling in the opposite direction thereto is supplied from a transducer 49E to a next acousto-optic medium 41H; and a progressive wave of frequency $f_2$ traveling in the opposite direction thereto is supplied from a transducer 49F to a next acousto-optic medium 41I adjacent to it. In this case, an ultrasonic acting area 48E of a common width D5 is formed by the progressive waves passing in the acousto-optic media 41F to 41I.

A synthetic progressive wave of frequency $f_3$ ($=(f_1-f_2)/2$) is formed in the ultrasonic acting area 48E. Thus, the light beam $L_1$ is actually diffracted by the progressive wave of frequency $f_3$ to become +first order diffracted light (light beam) $L_1$ (1), but conceptually, the light beam $L_1$ (1) can be regarded as composed of mixed waves between the +first order diffracted light by the progressive wave of frequency $f_1$ in the light beam $L_1$ and the +first order diffracted light by the progressive wave of frequency $f_2$. This can be applied to the other light beam (not shown) incident in symmetry with the light beam $L_1$.

In this case, the plurality of acousto-optic media 41F to 41I may be made of different materials, but the all wavelengths of the ultrasonic waves in the respective acousto-optic media should be preferably equal to each other. Even if there is a difference between speeds of sound due to a difference of materials, because the wavelength is defined as $\Lambda=v/f$ using the speed v and frequency f of ultrasonic waves, an equal wavelength $\Lambda$ of ultrasonic waves can be set by adjusting the frequencies f of ultrasonic waves. Since diffraction by the plurality of acousto-optic media thus separated can be considered as occurring in one ultrasonic acting area 48E, a diffraction efficiency thereof is equal to that in the case with a single acousto-optic medium.

It is noted that numbers of acousto-optic media in which ultrasonic waves travel in mutually opposite directions do not always have to be coincident with each other for the two directions. However, from the sum Σ as defined by Formula (9), a value of sum in each of the two directions should be preferably Σ/2.

Generally, for example in FIG. 10, when an ultrasonic wave is applied to an acousto-optic medium 41A, a compressional wave is generated in the medium whereby different index regions are generated in a grating pattern. This is equivalent to formation of a so-called phase grating in the acousto-optic modulator 41A, so that light passing through this phase grating is diffracted. When the zeroth order light and the first order diffracted light, for example, is taken out of the diffracted light to be refocused, interference fringes appear at a pitch equal to the pitch of the phase grating.

On that occasion, if the ultrasonic wave is a progressive wave, the compressional wave in the acousto-optic medium 41A moves at the speed of sound, so that the above phase grating and interference fringes as an image thereof also move. Considering it from another point of view, the first order diffracted light can be regarded as frequency-modulated. A modulation frequency f in the frequency modulation is expressed by the following formula when a moving speed of interference fringes is V and the pitch of interference fringes is p.

$$f=V/p \qquad (1)$$

Alternatively, the modulation frequency f can be expressed as follows when the sound speed of the ultrasonic wave is v and the wavelength of the ultrasonic wave is $\Lambda$, $$f=v/\Lambda \qquad (2)$$

Normally, the speed of sound v is some thousand m/s and the wavelength $\Lambda$ is some ten μm, resulting in the modulation frequency f being some ten MHz.

In order to decrease the value of modulation frequency f, as shown in FIG. 10, at least two ultrasonic waves 47A, 47B having slightly different frequencies $f_1$, $f_2$ are applied in mutually opposite traveling directions to the acousto-optic medium 41A.

Here, let us suppose that the following formulas represent the two progressive waves applied to the acousto-optic medium 41A when the above different frequencies of ultrasonic waves are $f_1$ and $f_2$ ($f_1>f_2$).

$$Y1=\sin\{2\pi(x/\Lambda 1-f_1\cdot t)\} \qquad (3)$$

$$Y2=\sin\{2\pi(x/\Lambda 2+f_2\cdot t)\} \qquad (4)$$

In the above formulas, x is a coordinate of a position in a propagating direction of ultrasonic wave in the acousto-optic medium, and $\Lambda 1$ and $\Lambda 2$ are wavelengths of the respective ultrasonic waves. Here, an initial phase difference between these two ultrasonic waves is omitted because it is not significant. From the principle of superposition of two waves, a resultant ultrasonic wave in the acousto-optic medium 41A is expressed by the following formula.

$$Y = Y1 + Y2 \qquad (5)$$
$$= \sin\{2\pi(x/\Lambda_1 - f_1 \cdot t)\} +$$
$$\sin\{2\pi(x/\Lambda_2 + f_2 \cdot t)\}$$
$$= 2\sin[2\pi\{x \cdot (1/\Lambda_1 + 1/\Lambda_2)/2 +$$
$$(f_2 - f_1)t/2\}] \times$$
$$\cos[2\pi\{x \cdot (1/\Lambda_1 - 1/\Lambda_2)/2 +$$
$$(f_2 + f_1)t/2\}]$$

Incidentally, because the wavelengths $\Lambda 1$, $\Lambda 2$ become nearly equal for very close frequencies $f_1$, $f_2$, let us introduce an average frequency f, an average wavelength $\Lambda$, and a frequency difference $\Delta f$ as defined by the following formulas.

$$f = (f_2 + f_1)/2,$$
$$\Lambda = (\Lambda 1 + \Lambda 2)/2,$$
$$\Delta f = (f_1 - f_2)$$

Then Formula (5) can be expressed by the following approximation.

$$Y = 2 \sin [2^\pi\{x/\Lambda - \Delta f \cdot t/2\}] \times \cos (2^\pi f \cdot t) \qquad (6)$$

Further, taking $\Delta f < f$ into consideration, Formula (6) can be regarded as a progressive wave of wavelength $\Lambda$ and frequency $\Delta f/2$. This is such a case that a time resolution of a photoelectric detector 33 is low and time-integrated with respect to the frequency f.

It is thus considered that in the acousto-optic medium 41A to which such two opposite ultrasonic waves 47A, 47B are applied there appears a progressive wave having a frequency equal to a half of a frequency difference between them, and interference fringes formed by light diffracted through this portion (ultrasonic acting area 48A) move at a speed of $\Delta f \cdot \Lambda$. Namely, it can bee considered that the diffracted light was frequency-modulated by $\Delta f$.

In other words, when the Bragg diffraction as shown in FIG. 10 is utilized, one light beam $L_1$ is subjected to frequency modulation of $\Delta f/2$ while the other light beam $L_2$ is subjected to frequency modulation of $-\Delta f/2$, thus causing a frequency difference of $\Delta f$ between them when emerging from the acousto-optic medium 41A. This means that the individual, large frequencies $f_1$, $f_2$ are beat down to $\Delta f$ using a single acousto-optic modulator.

Incidentally, when the opposite ultrasonic waves are applied to the acousto-optic medium 41A as shown in FIG. 10, it is necessary for the progressive waves thereof to be prevented from being reflected by the associated end faces. Reflection would cause a standing wave, which would result in mixing of noise components in the frequency modulation of diffracted light. Then reflected waves of the ultrasonic waves are reduced by an end face treatment, for example by attaching sound absorbing members 46A, 46B to the end faces of the acousto-optic medium 41A.

In another arrangement, as shown in FIG. 11, transducers 43C, 43D for generating the ultrasonic waves are arranged alternately so as to prevent regions to which ultrasonic waves 47C, 47D are applied, from overlapping with each other in an ultrasonic actingarea 48B for incident light rays. Further, the respective end faces are processed by such an end face treatment that ultrasonic absorbing members are attached to the end faces to suppress reflected waves. In this arrangement, when rays pass inside each of the progressive waves 47C, 47D, the respective progressive waves act thereon, which is equivalent to a case where a progressive wave similar to Formula (6) as described above acts on the rays from the principle of superposition of waves.

In this case, for example in the example of FIG. 10, the ultrasonic acting area 48A for cases utilizing the acoustic Bragg diffraction is a region having such a width D1 (a width in a direction perpendicular to the traveling direction of ultrasonic wave) as to maximize a diffraction efficiency $\eta$ as defined by the following formula when $\lambda$ is the wavelength of ultrasonic wave in the acousto-optic medium 41A, M is a figure of merit determined by the acousto-optic medium, and Ia is an intensity of an ultrasonic wave supplied.

$$\eta = \sin^2\{\pi \cdot D1(M \cdot Ia)^{1/2}/(2^{1/2}\lambda)\} \qquad (7)$$

This is described for example in Kunio TADA and Takeshi KAMIYA: fundamentals of optoelectronics, p327 (1980, MARUZEN). If a plurality of ultrasonic waves are applied, the intensity Ia is a sum of intensities of the respective ultrasonic waves. For cases utilizing the Raman-Nath diffraction, the diffraction efficiency $\eta$ is expressed as follows using the Bessel function of the first kind.

$$\eta = J_1^2\{2^{1/2}\pi \cdot D1(M \cdot Ia)^{1/2}/\lambda\} \qquad (8)$$

Further, if it is within a same ultrasonic acting area, a plurality of acousto-optic media 41D, 41E, to each of which a single ultrasonic wave is applied, as shown in FIG. 13, may be arranged so that ultrasonic traveling directions therein become opposite to each other. In the case of FIG. 13, it is considered that the same progressive wave as Formula (6) acts on an incident light beam from the same reason.

When the ultrasonic acting area 48D ranges over the plurality of acousto-optic media 41D, 41E as shown in FIG. 13, let us assume that widths of ultrasonic existing regions in the respective acousto-optic media 41D, 41E are $D_{41}$, $D_{42}$, ..., wavelengths of light in the respective acousto-optic media 41D, 41E are $\lambda_1$, $\lambda_2$, ..., figures of merit are $M_1$, $M_2$, ..., and intensities of ultrasonic waves supplied are $Ia_1$, $Ia_2$, .... Then the ultrasonic acting area 48D is a region having such a length D4 to maximize the diffraction efficiency $\eta$ obtained by replacing the value D1 $(M \cdot Ia)^{1/2}/\lambda$ in Formula (7) or Formula (8) by a quantity $\Sigma$ expressed by the following formula.

$$\Sigma = D_{41}(M_1 \cdot Ia_1)^{1/2}/\lambda_1 + D_{42}(M_2 \cdot Ia_2)^{1/2}/\lambda_2 + \ldots \qquad (9)$$

Incidentally, because the intensity Ia in the above Formulas (7), (8), and (9) behaves like the wave of superposition expressed by Formula (6), consideration is necessary to maximize it on time average.

Figure 15:
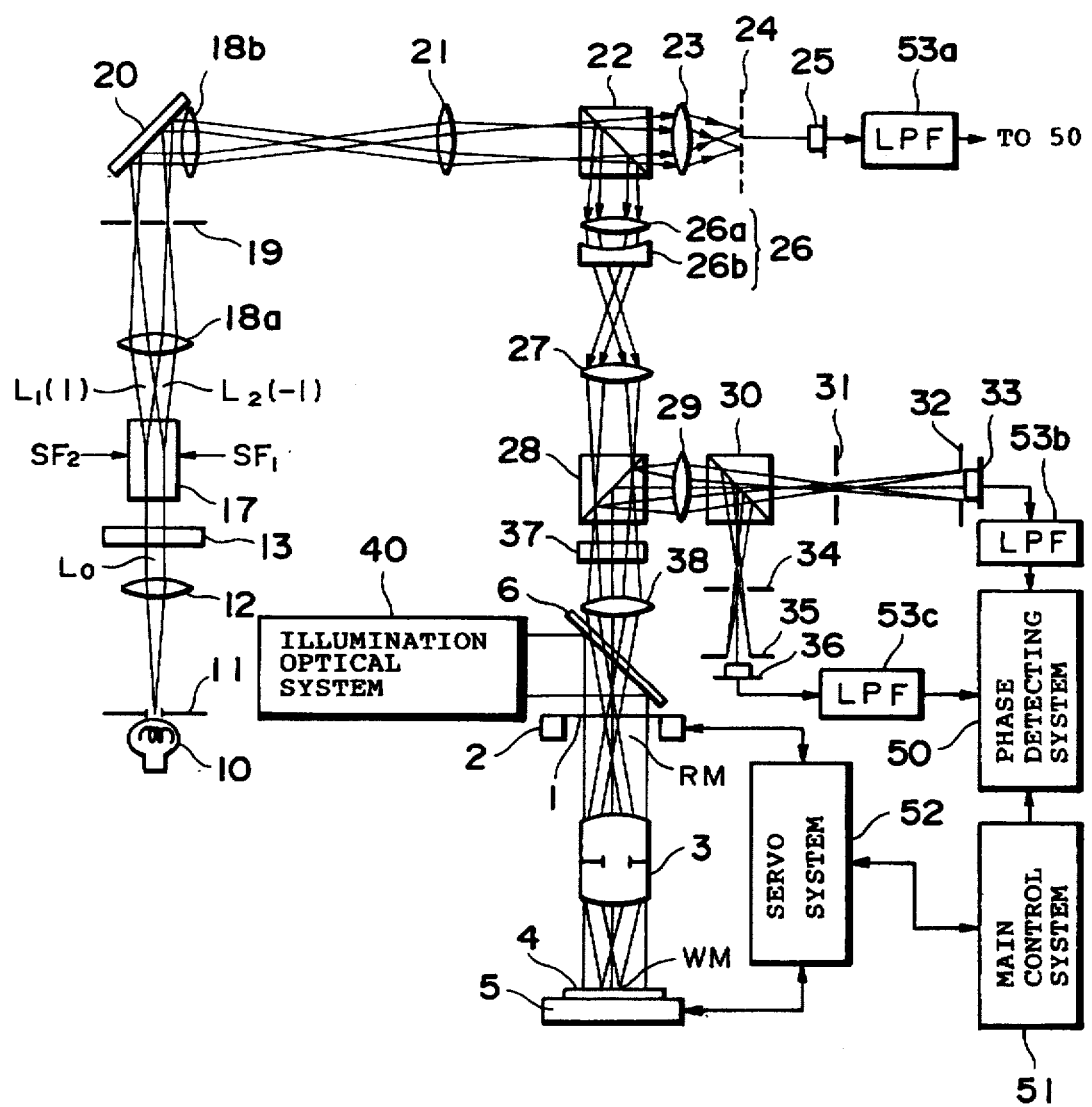
FIG. 15 is a structural drawing to show a schematic structure of a projection exposure apparatus in the second embodiment of the present invention.

The second embodiment according to the present invention is next described referring to FIG. 15. The second embodiment is also an application of the present invention to the alignment system of the heterodyne interference type in projection exposure apparatus. In FIG. 15, elements corresponding to those in FIG. 1 are denoted by the same reference numerals and the detailed description thereof is omitted herein. It should be noted that the present embodiment is an example using the acousto-optic modulator in a Raman-Nath diffraction area.

FIG. 15 shows a projection exposure apparatus of the present embodiment. In an alignment optical system of FIG. 15, white light from a white light source 10, supplying light in a wavelength band different from that of exposure light, is guided through an aperture-variable stop 11 and a condenser lens 12 to be converted into a parallel light beam $L_0$ and thereafter the parallel light beam $L_0$ is guided through a band-pass filter 13 for extracting light in a predetermined wavelength region to be incident nearly normal to AOM 17.

AOM 17 is driven by high-frequency signals $SF_1$ and $SF_2$ of respective frequencies $f_1$ and $f_2$ (where $f_1 > f_2$) in the opposite directions, and the light beam $L_0$ in the predetermined wavelength region is subjected to the Raman-Nath diffraction by AOM 17. In the following description, the orders of diffracted light are taken with respect to the reference of a traveling direction of a progressive wave by the high frequency signal $SF_1$.

Here, assuming the frequency (center frequency) of the light beam $L_0$ in the predetermined wavelength region is $f_0$, +first order diffracted light $L_1$ (1) (hereinafter referred to as "light beam $L_1$ (1)") of the light beam $L_0$ is subjected to frequency modulation of $(f_0 + f_3)$ (where $f_3 = (f_1 - f_2)/2$) by AOM 17, and -first order diffracted light $L_2$ (-1) (hereinafter referred to as "light beam $L_2$ (-1)") of the light beam $L_0$ is subjected to frequency modulation of $(f_0 - f_3)$ by AOM 17.

After that, the light beam $L_1$ (1) and light beam $L_2$ (-1) travel via lens 18a, reflective mirror 20, lens 18b, and lens 21 to be split each into two beams by a beam splitter 22. A spatial filter 19 for extracting the light beam $L_1$ (1) and light beam $L_2$ (-1) is disposed in a relay optical system composed of the lens 18a and lens 18b. The zeroth order light and higher order diffracted light also emerges from AOM 17, but they are filtered out by the spatial filter 19. Since the other structure is the same as that of the embodiment of FIG. 1, the description thereof is omitted herein.

Figure 7:
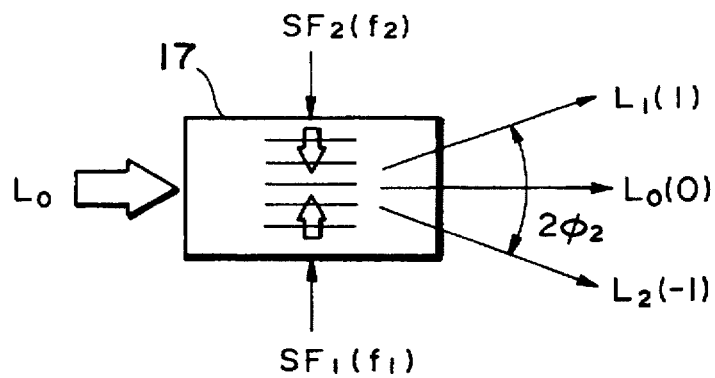
FIG. 7 is an explanatory drawing of the principle of the Raman-Nath diffraction by an acousto-optic modulator.

Next described referring to FIG. 7 are specific structure and theory for the portion for making two light beams of mutually different frequencies in the second embodiment.

As shown in FIG. 7, when the light beam $L_0$ of white light is incident normal to AOM 17, diffracted light of individual orders appears every wavelength by the Raman-Nath diffraction function of AOM 17. In this case, the following relation holds where $\phi_2$ is an angle of diffraction of diffracted light relative to a direction of the normal line to AOM 17, $\Lambda_G$ is a wavelength of a progressive wave in AOM 17, v is a speed of the progressive wave, $\lambda$ is a wavelength of light, and the order of diffracted light is first.

$$\Lambda_G = v/f(=(f_1+f_2)/2) \quad (26)$$

$$\sin \phi_2 = \lambda/\Lambda_G \quad (27)$$

Thus, if the diffraction angle $\phi_2$ defined by this Formula (27) coincides with a half of the diffraction angle $\theta_{b1}$ in Formula (15), the optical system of FIG. 1 can also be used in FIG. 15 as it is.

The AOM 17 in FIG. 15 may be either one of the AOM structures in FIG. 10 to FIG. 14. By the example of FIG. 15, the diffraction grating 14 etc. in FIG. 1 can be obviated and the structure can be simplified.

Figure 18:
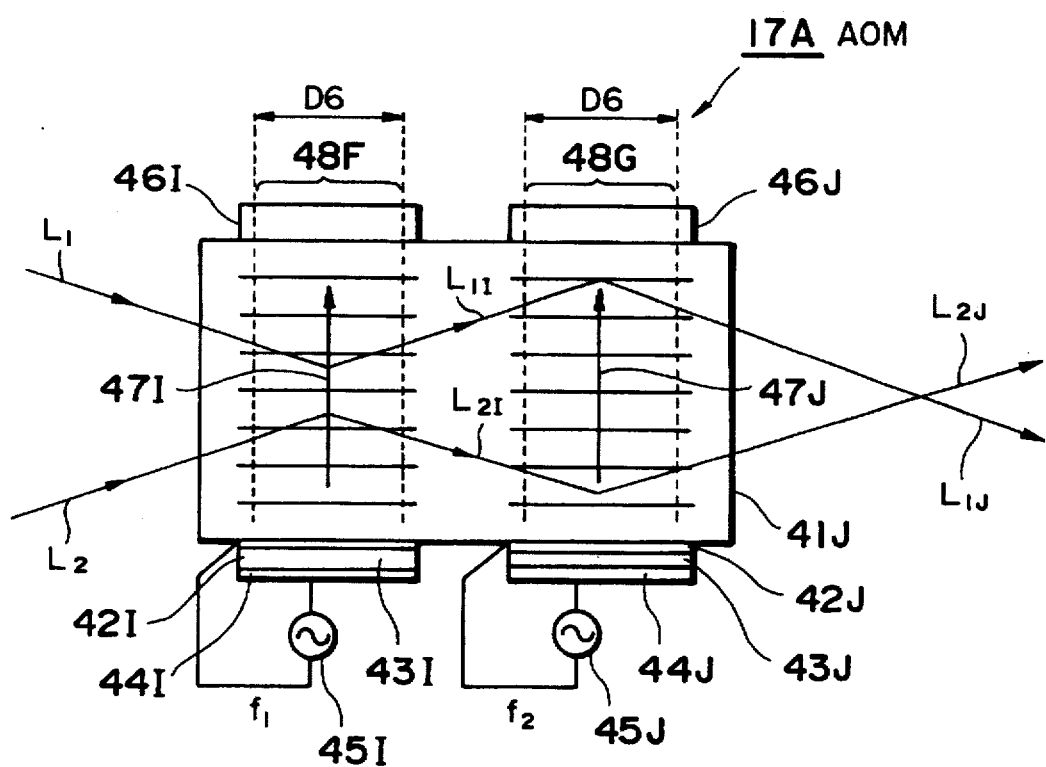
FIG. 18 is a structural drawing to show an acousto-optic modulator used in the third embodiment according to the resent invention.

The acousto-optic modulator used in the second embodiments position detecting apparatus of the present invention has, as shown in FIG. 18, two independent ultrasonic acting areas 48F, 48G. In this case, Formula (7) or Formula (8) holds as to a width D6 of each ultrasonic acting area 48F, 48G. Then ultrasonic waves of mutually slightly different frequencies $f_1$, $f_2$ are supplied in a same direction to the ultrasonic acting areas 48F, 48G. As a result, for example supposing the Bragg diffraction is utilized, one light beam $L_1$ obliquely incident is first diffracted by the first ultrasonic acting area 48F and +first order diffracted light $L_{1I}$ thereof frequency-modulated by the frequency $f_1$ travels toward the second ultrasonic acting area 48G.

The +first order diffracted light $L_{1I}$ is diffracted by the second ultrasonic acting area 48G, and -first order diffracted light $L_{1J}$ frequency-modulated by the frequency $-f_2$ travels toward a subsequent objective optical system. Accordingly, a modulation amount of frequency of diffracted light $L_{1J}$ traveling toward the objective optical system is $(f_1-f_2)$. Similarly, as for the other light beam $L_2$ obliquely incident, it becomes diffracted light $L_{2J}$ after frequency-modulated by $-(f_1-f_2)$ by the two ultrasonic acting areas 48F, 48G. Accordingly, a frequency difference between the two light beams $L_{1J}$, $L_{2J}$ emerging from the second ultrasonic acting area 48G is $2(f_1-f_2)$ (=$2 \cdot \Delta f$), and thus, the two high frequencies $f_1$, $f_2$ are beat down. The modulation frequency is doubled as compared with that of the first position detecting apparatus (FIG. 10).

The third embodiment according to the present invention is next described referring to FIG. 18. A projection exposure apparatus used in the present embodiment is substantially the same as that of FIG. 1 except that the AOM 17 of FIG. 1 is replaced by AOM 17A of FIG. 18.

FIG. 18 shows AOM (acousto-optic modulator) 17A of the present embodiment. In FIG. 18, sound absorbing members 46I and 46J are bonded to one side surface of an acousto-optic medium 41J, and a transducer 43I between electrode plates 42I, 44I and a transducer 43J between electrode plates 42J, 44J are bonded to the other side surface of the acousto-optic medium 41J as opposed to the sound absorbing members 46I and 46J, respectively. Drive signals of frequencies $f_1$ and $f_2$ are supplied from respective high-frequency power supplies 45I and 45J to the transducers 43I and 43J, respectively. In this case, progressive waves 47I and 47J are supplied in a same direction and in parallel from the transducers 43I and 43J to the acousto-optic medium 41J, thereby forming an ultrasonic acting area 48F of a width D6 by the progressive wave 47I and an ultrasonic acting area 48G of a width D6 by the progressive wave 47J, independently of each other.

Then a progressive wave of frequency $f_1$ is formed in the ultrasonic acting area 48F while a progressive wave of frequency $f_2$ is formed in the ultrasonic acting area 48G. Thus, the light beam $L_1$ is first diffracted (+first-order-diffracted) in the ultrasonic acting area 48F so as to be subjected to modulation of frequency $f_1$ to become a light beam $L_{1I}$, and the light beam $L_{1I}$ then enters the ultrasonic acting area 48G. The light beam $L_{1J}$ is -first-order-diffracted in the ultrasonic acting area 48G so as to be subjected to modulation of frequency $-f_2$ to be emergent as a light beam $L_{1J}$. Accordingly, the light beam $L_{1J}$ is subjected to the frequency modulation of $(f_1-f_2)$.

Similarly, the other light beam $L_2$ is first diffracted (-first-order-diffracted) in the ultrasonic acting area 48F so as to be subjected to modulation of frequency $-f_1$ to be emergent as a light beam $L_{2I}$, and the light beam $L_{2I}$ is incident into the ultrasonic acting area 48G. The light beam $L_{2I}$ is +first-order-diffracted in the ultrasonic acting area 48G so as to be subjected to modulation of frequency $f_2$ to be emergent as a light beam $L_{2f}$. Accordingly, the light beam $L_{2f}$ is subjected to the frequency modulation of $-(f_1-f_2)$. As a result, a beat frequency between the light beam $L_{2f}$ and the light beam $L_{2f}$ thus emerging is $2(f_1-f_2)$, as beat down in frequency. Here, the beat frequency obtained in FIG. 18 is the double of the beat frequency obtained in FIG. 10.

FIG. 18 shows an example in which the two ultrasonic acting areas 48F, 48G are formed in parallel in one acousto-optic medium 41J, but ultrasonic acting areas in which respective progressive waves travel in a same direction may be formed independently of each other in a plurality of adjacent acousto-optic media. In that case, because there is a possibility that the zeroth order light is mixed in the each diffracted light in FIG. 18, a spatial filter should be preferably provided to select only the diffracted light by rotating each of plural acousto-optic media about the optical axis.

Figure 16:
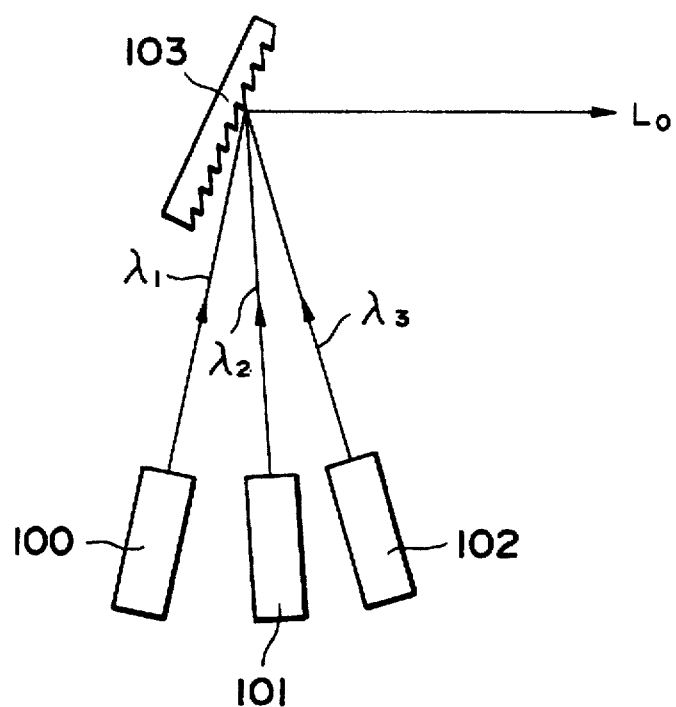
FIG. 16 is a drawing to show an example in which the light source means is composed of a plurality of light sources for emitting respective light beams of mutually different wavelengths and a blazed reflection type diffraction grating.
Figure 17:
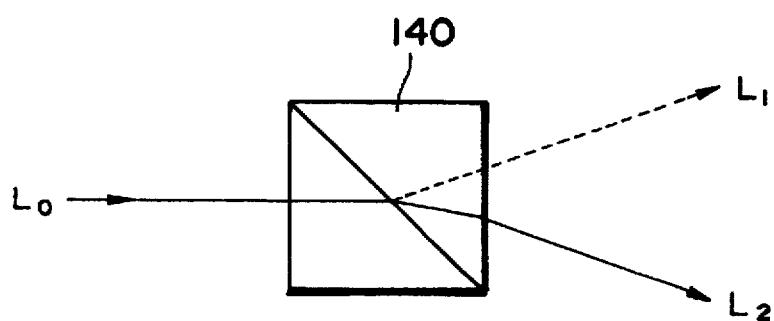
FIG. 17 is a drawing to show an example in which beam splitting means is constructed of a Wollaston prism.

Incidentally, The first embodiment (FIG. 1) as described above is so arranged that the white light (multi-wavelength light) supplied from the light source means 10 to 12 is split in symmetry with respect to the incident direction (the direction of the optical axis) by the diffraction grating 14 as beam splitting means, but for example, a Wollaston prism 140 as shown in FIG. 17 may be used as beam splitting means different from the diffraction grating 14. Further, as shown in FIG. 16, a light beam $L_0$ may be formed on a same axis by multiplexing light beams of wavelengths $\lambda_1$ to $\lambda_3$ emitted from a plurality of monochromatic light sources 100 to 102, using a reflection type diffraction grating 103, and the obtained light beam $L_0$ may be used instead of the light beam $L_0$ emitted from the white light source of FIG. 1.

In each of the embodiments shown in FIG. 1 and FIG. 15, a beat signal of a predetermined frequency is extracted from a signal photoelectrically detected by each photoelectric detector 25, 33, 36 by the optical beat signal extracting portion inside the phase difference detecting system 50, but an alternative arrangement may be such that an optical beat signal extracting portion (Fourier transform circuit) is disposed in an electric path between each photoelectric detector 25, 33, 36 and the phase difference detecting system 50 and that each photoelectric signal output from each photoelectric detector 25, 33, 36 is Fourier-transformed independently.

Next the fourth embodiment of the position detecting apparatus according to the present invention will be explained with reference to FIG. 19 to FIG. 24. The present embodiment is an example in which the present invention is applied to an alignment system of the heterodyne interference type in the projection exposure apparatus and the Raman-Nath diffraction is utilized.

Figure 19:
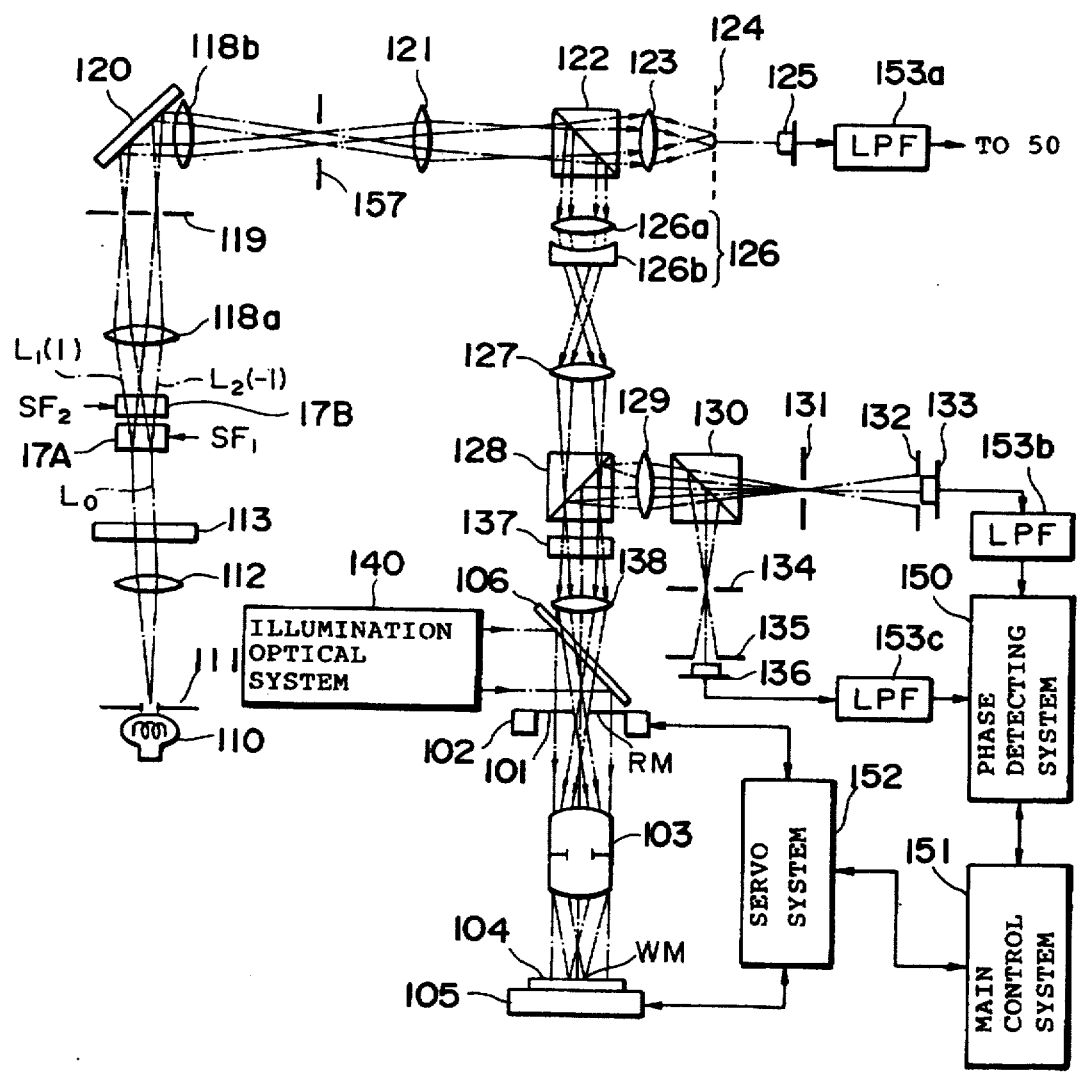
FIG. 19 is a structural drawing to show a schematic configuration of a projection exposure apparatus of the fourth embodiment according to the present invention.

FIG. 19 shows the projection exposure apparatus of the fourth embodiment. In this FIG. 19, all of the elements except for some elements constructing the two-beam generator, are the same as those of the elements of the first embodiments in structure and the function thereof. Therefore, the explanation of the same elements will be omitted.

In two-beam generator of the alignment optical system of FIG. 19, white light from a white light source 10 such as a Xe lamp or a halogen lamp for supplying light in the wavelength band different from that of the exposure light travels through a variable stop 11 having a variable aperture and a condenser lens 12 to be converted into a parallel beam $L_0$, and thereafter it travels through a band-pass filter 13 for extracting light in a predetermined wavelength region to be incident to a first acousto-optical modulator (hereinafter referred to as "AOM") 17A nearly normally thereto. The second AOM 17B is disposed at the predetermined spacing after the first AOM 17A, the AOMs 17A and 17B are driven in opposite directions by high-frequency signals $SF_1$ and $SF_2$ of respective frequencies $f_1$ and $f_2$ (where $f_1 > f_2$), and the beam $L_0$ in the predetermined wavelength region is subjected to the Raman-Nath diffraction by the AOMs 17A, 17B. In the following description, the orders of diffracted light are taken with reference to the traveling direction of the traveling wave by the high-frequency signal $SF_1$.

Here, letting $f_0$ be the frequency (center frequency) of the beam $L_0$, mixture light of the +first-order diffracted light (hereinafter referred to as "beam $L_1(1)$") from the two AOMs 17A, 17B with the beam $L_0$ is subjected to frequency modulation of substantially $(f_1-f_2)/2$ by those two AOMs and mixture light of the −first-order diffracted light (hereinafter referred to as "beam $L_2(-1)$") from the two AOMs 17A, 17B with the beam $L_0$ is subjected to frequency modulation of substantially $(f_2-f_1)/2$ by the two AOMs 17. However, as explained with Eq. (37), the beam $L_1(1)$ and the beam $L_2(-1)$ contain components modulated at higher frequencies than the frequencies $f_1$, $f_2$.

After that, the beam $L_1(1)$ and the beam $L_2(-1)$ travel via the beam splitter 22 and reflected by the beam splitter 22, pass the optical path and optical elements etc. which are the same as those of the first embodiment. Therefore, optical operations and the functions thereof will be omitted.

Figure 20:
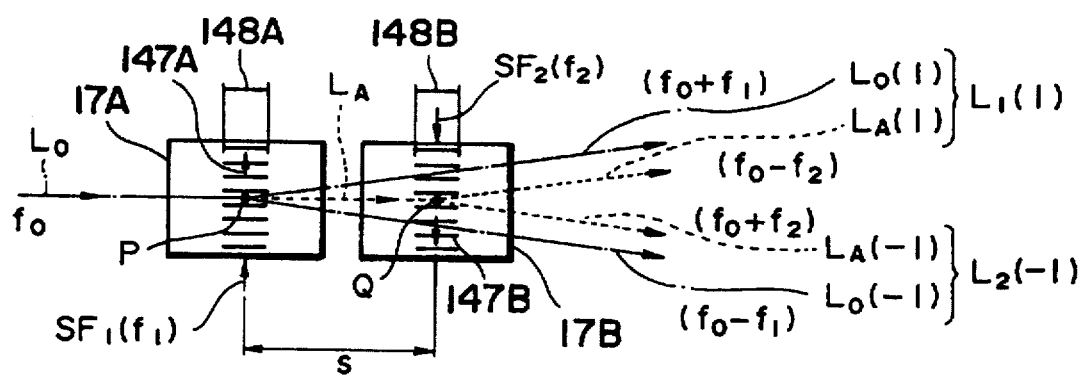
FIG. 20 is a conceptual drawing to show a configuration of a two-beam generating portion (a portion for generating two beams of mutually different frequencies) in FIG. 19.
Figure 21:
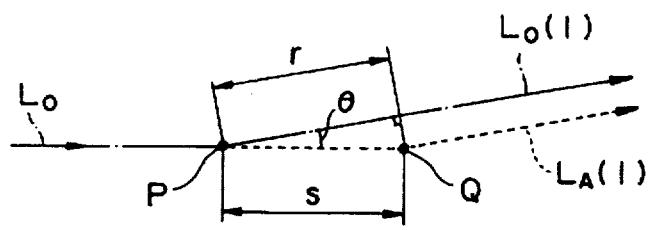
FIG. 21 is a drawing used for explaining the phase difference between diffracted light beams from two acousto-optic elements in the fourth embodiment.
Figure 22:
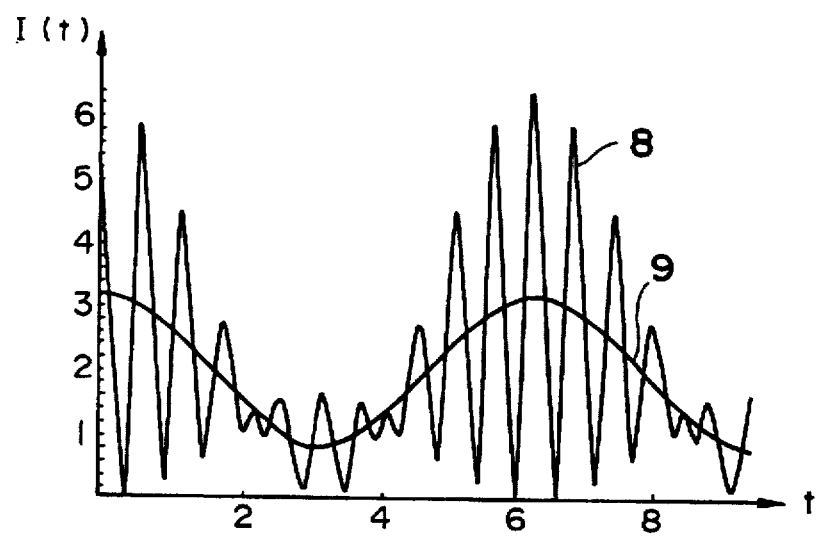
FIG. 22 is a waveform diagram to show an example of light intensity I (t) of interference light obtained in the fourth embodiment.

Next explained referring to FIG. 20 are a specific arrangement and the principle of the portion for generating the two beams of the mutually different frequencies in the fourth embodiment.

As shown in FIG. 20, when the beam $L_0$ of white light is incident normally to the first AOM 17A, the zeroth-order light $L_A$, the +first-order diffracted light $L_0(1)$, the −first-order diffracted light $L_0(-1)$, and the other higher-order diffracted light occurs for every wavelength from the AOM 17A by the Raman-Nath diffraction of AOM 17A, and these light beams are normally incident to the second AOM 17B. At this time the following relations hold when $\phi_2$ is an angle of diffraction of diffracted light with respect to the direction normal to the AOM 17A, AG is the wavelength of the traveling wave 147A in the AOM 17A, v is the velocity of the traveling wave, $\lambda$ (frequency $f_0$) is the wavelength of light, and the order of the diffracted light is first.

$$\Lambda_G = v/f_1 \tag{42}$$

$$\sin \phi_2 = \lambda/\Lambda_G \tag{43}$$

From the zeroth-order light $L_A$ from the first AOM 17A, the zeroth-order light, +first-order diffracted light $L_A(1)$, −first-order diffracted light $L_A(-1)$, and the other higher-order diffracted light occurs for every wavelength from the AOM 17B by the Raman-Nath diffraction of the second AOM 17B. This example uses the beam $L_1(1)$ in which the +first-order diffracted light $L_A(1)$ from the AOM 17B is mixed with the beam of the +first-order diffracted light $L_0(1)$ from the AOM 17A, having passed through the AOM 17B as it is. Also used is the beam $L_2(-1)$ in which the −first-order diffracted light $L_A(-1)$ from the AOM 17B is mixed with the beam of the −first-order diffracted light $L_0(-1)$ from the AOM 17A, having passed through the AOM 17B as it is. The +first-order diffracted light $L_0(1)$ is frequency-modulated to the frequency $(f_0+f_1)$, the +first-order diffracted light $L_A(1)$ to the frequency $(f_0-f_2)$, the −first-order diffracted light $L_0(-1)$ to the frequency $(f_0-f_1)$, and the −first-order diffracted light $L_A(-1)$ to the frequency $(f_0+f_2)$. Accordingly, the modulation frequency of the beam $L_1(1)$ is substantially $(f_1-f_2)$ while the modulation frequency of the beam $L_2(-1)$ is substantially $(f_2-f_1)$.

Figure 23:
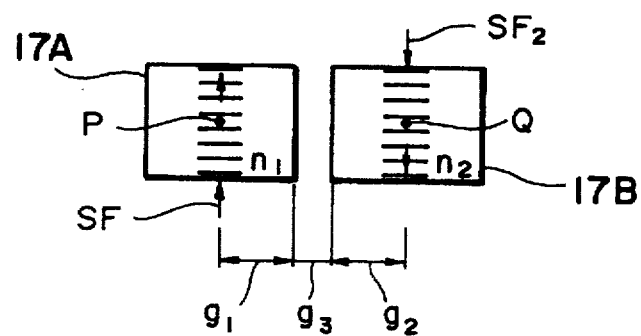
FIG. 23 is an explanatory drawing to illustrate a method for calculating a spacing as an air length.

In this example, the spacing s calculated as an air length between the center P of the ultrasonic acting region 148A of AOM 17A and the center Q of the ultrasonic acting region 148B of AOM 17B is set to satisfy the condition of Eq. (29) or Eq. (30). As shown in FIG. 23, letting $n_1$ and $n_2$ be refractive indices of the AOMs 17A and 17B, respectively, $g_1$ be a spacing from the center P of the ultrasonic acting region in the AOM 17A to the exit surface of AOM 17A, $g_3$ be a spacing between the AOMs 17A and 17B, and $g_2$ be a spacing from the entrance surface of AOM 17B to the center Q of the ultrasonic acting region in the AOM 17B, the spacing s as an air length is expressed by the following equation.

$$s = g_1/n_1 + g_2/n_2 + g_3 \quad (44)$$

Since the condition of Eq. (29) or Eq. (30) is satisfied, this example is arranged so that in FIG. 20 the phase difference $\phi$ between the +first-order diffracted light $L_0(1)$ (or the −first-order diffracted light $L_0(-1)$) from the AOM 17A and the +first-order diffracted light $L_A(1)$ (or the −first-order diffracted light $L_A(-1)$) from the AOM 17B may be between $(m-\frac{1}{3})^\pi$ and $(m+\frac{1}{3})^\pi$ where m is an integer, and thus the contrast of the optical beat signal obtained is high. It is needless to mention that the phase difference $\phi$ is desirably as close to $m^\pi$ as possible.

The diffraction angle $\phi_2$, in the second AOM 17B can be regarded as nearly equal to the diffraction angle $\phi_2$. The diffraction angle $\phi_2$ becomes the angle $\theta_{RM}$ of incidence (see Eq. (11)) to the diffraction grating mark RM via the lens system 18a to the objective 38 in FIG. 19 Therefore, when the two beams $L_1(1)$ and $L_2(-1)$ are incident to the diffraction grating mark RM, ±first-order diffracted light is emergent normally upward from the diffraction grating mark RM.

Returning to FIG. 19, because in the present embodiment the beam $L_1(1)$ comprised of the +first-order diffracted light having the predetermined wavelength region and the beam $L_2(-1)$ comprised of the −first-order diffracted light having the predetermined wavelength region can be guided in symmetry at different incidence angles for respective wavelengths to each diffraction grating 24, RM, WM, the ±first-order diffracted light of each wavelength can always occur in the direction normal to each diffraction grating 24, RM, WM. As a result, beat light containing the predetermined frequency Δf ($=f_1-f_2$) can be produced from the ±first-order diffracted light of each wavelength. Accordingly, each photoelectric detector 25, 33, 36 can photoelectrically detect multi-wavelength beat light containing the predetermined frequency Δf (it can detect a plurality of beat light beams of the respective wavelengths containing the information on the position of each diffraction grating). Consequently, as suppressing influence of asymmetry of each diffraction grating mark by the averaging effect of the beat light of each wavelength, the present embodiment can overcome the influence of thin-film interference of the photoresist layer (influence such as light quantity changes) by the multi-wavelength light, and high-accuracy alignment can be achieved by the heterodyne interference method.

In addition, the white light (multi-wavelength light) separated in symmetry with respect to the incidence direction (the optical-axis direction) by the diffraction grating 14 (beam splitting means) propagates in symmetry and in parallel in the relay optical system 15a, 15b and AOMs 17, and no optical path difference theoretically occurs between the separate beams. Thus, the wavefronts between the separate beams are aligned with the phase difference being 0, which enables high-accuracy alignment and which can realize a compact apparatus easy in adjustment.

Next explained referring to FIG. 24 to FIG. 28 are a specific configuration of the two AOMs 17A, 17B used in the fourth embodiment, and configurations of modifications thereof.

Figure 24:
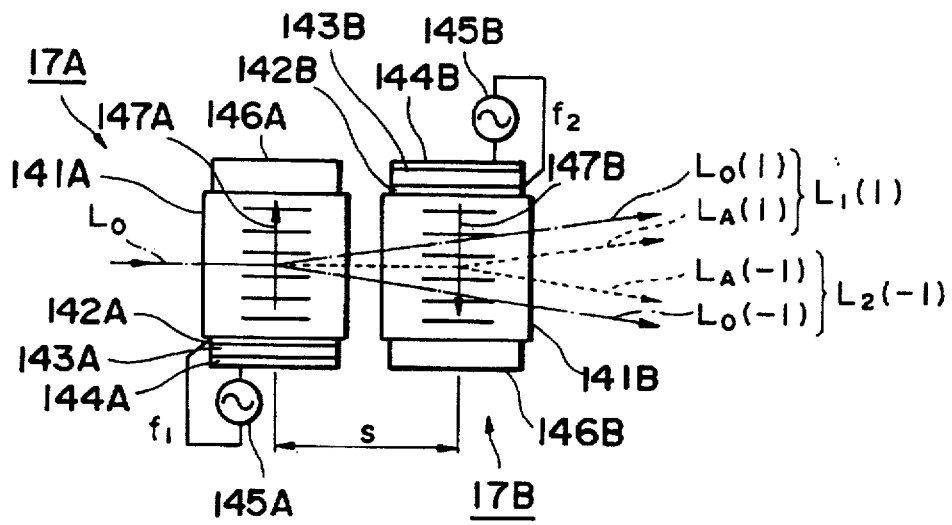
FIG. 24 is a structural drawing to show the acousto-optico elements used in the fourth embodiment.

FIG. 24 shows the AOMs 17A, 17B used in FIG. 19. In the first AOM 17A of FIG. 24, an electrode plate 142A, a transducer 143A for generation of ultrasonic wave, and an electrode plate 144A are fixed in order on one side face of an acousto-optic medium 141A, while a sound absorber 146A is fixed on the other side face thereof. A drive signal of frequency $f_1$ is supplied from a high-frequency power supply 145A to between the electrode plates 142A and 144A, whereby a traveling wave 147A is formed. In the second AOM 17B, an electrode plate 142B, a transducer 143B for generation of ultrasonic wave, and an electrode plate 1 are fixed in order to the other side face of an acousto-optic medium 141B, while a sound absorber 146A is fixed to the one side face thereof. A drive signal of frequency $f_2$ is supplied from a high-frequency power supply 145B to between the electrode plates 142B and 144B, whereby a traveling wave 147B traveling in the opposite direction to the traveling wave 147A in the first AOM 17A is formed. The sound absorbers 146A and 146B function to absorb the ultrasonic waves (traveling waves) from the opposed transducers 143A and 143B, respectively, thereby preventing occurrence of reflected waves.

In this case, the acousto-optic media 141A, 141B may be of one selected from normal glasses, a single crystal of tellurium dioxide ($TeO_2$), rock crystal, quartz, a single crystal of lead molybdate, and so on. The sound absorbers 146A, 146B may be made of a material that has an acoustic impedance close to that of the acousto-optic media 141A, 141B and that is apt to absorb sound waves. The acoustic impedance is a product of density and sound velocity. Specifically, the sound absorbers 146A, 146B can be metal films of lead or aluminum. The transducers 143A, 143B can be made of a single crystal of lithium niobate ($LiNbO_3$), a single crystal of $LiIO_3$, a single crystal of $Ba_3NaNb_5O_{15}$, or the like.

The region sandwiched between the transducer 143A and the sound absorber 146A forms the first ultrasonic acting region while the region sandwiched between the transducer 143B and the sound absorber 146B forms the second ultrasonic acting region. Out of the beam $L_0$ incident, mixture light of the +first-order diffracted light $L_0(1)$ diffracted by the traveling wave 147A in the AOM 17A with the +first-order diffracted light $L_A(1)$ diffracted by the traveling wave 147B in the AOM 17B becomes the beam $L_1(1)$, whereas mixture light of the −first-order diffracted light $L_0(-1)$ diffracted by the traveling wave 147A with the −first-order diffracted light $L_A(-1)$ diffracted by the traveling wave 147B becomes the beam $L_2(-1)$. The modulation frequency of the beam $L_1(1)$ is substantially $(f_1-f_2)/2$, while the modulation frequency of the beam $L_2(-1)$ is substantially $-(f_1-f_2)/2$. As an example, the drive frequency $f_1$ of transducer is about (20 MHz+some 10 kHz), the drive frequency $f_2$ is about 20 MHz, and the beat frequency $(f_1-f_2)$ is some 10 kHz.

In this case, the spacing s calculated as an air length between the center of the ultrasonic acting region in the AOM 17A and the center of the ultrasonic acting region in the AOM 17B is set to satisfy the condition of Eq. (29) or Eq. (30). Specifically, the center wavelength of the beam $L_0$ incident is 633 nm, and the beam size of the beam $L_0$ is 2 mm. Then, supposing the sound velocity v of the ultrasonic waves in the AOMs 17A, 17B is 3000 m/s, the spacing s is about 35.5 mm as an example. As seen from FIG. 24, the +first-order diffracted light beam $L_0(1)$ from the AOM 17A and the +first-order diffracted light beam $L_A(1)$ from the AOM 17B have the positional deviation approximately proportional to the spacing s, but, if the spacing s is about 35.5 mm, an amount of the positional deviation is as small as about 0.15 mm.

However, even if the amount of positional deviation between the two diffracted light beam is small, the beam in portions deviated in position becomes noise light. If the noise light is received as it is, it becomes a factor to lower the contrast of the optical beat signal obtained. Therefore, the embodiment of FIG. 19 is provided with the field stop 157 for removing such noise light.

Figure 26:
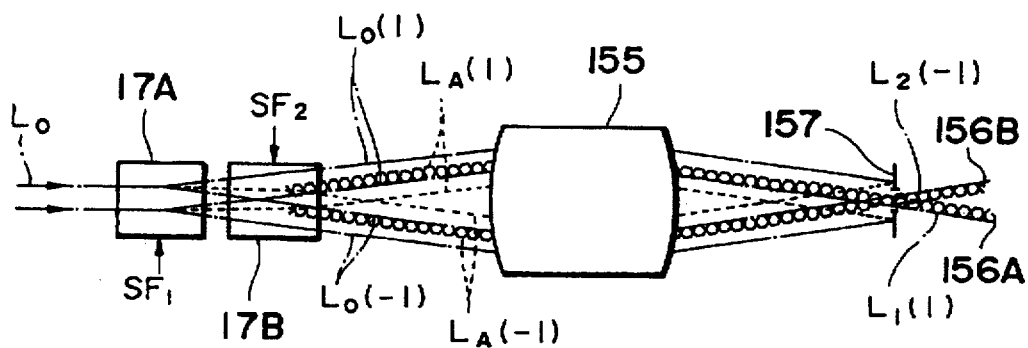
FIG. 26 is a conceptual drawing used for explaining the action of the field stop 157 in FIG. 19.

FIG. 26 shows a simplified form of the major part of FIG. 19. In FIG. 26 the optical system of from the lens 18a to the lens 18b in FIG. 19 is illustrated as a relay lens system 155. In this case, the field stop 157 is located at the position conjugate with the middle point between the center of AOM 17A and the center of AOM 17B with respect to the relay lens system 155. Then the field stop 157 interrupts the light beam in the peripheral region around an overlaying region 156A of the two diffracted light $L_0(1)$ and $L_A(1)$ and the light beam in the peripheral region around an overlaying region 156B of the diffracted light $L_0(-1)$ and $L_A(-1)$. Since the beams $L_1(1)$ and $L_2(-1)$ obtained include only components having been subjected to necessary frequency modulation in this example, the contrast is improved for the optical beat signal finally obtained.

The spacing s between the two AOMs 17A, 17B is desirably as close to 0 as possible, but the spacing s cannot be 0 when they are disposed adjacent to each other as shown in FIG. 24. The spacing s can be substantially 0 by placing the relay lens system between the two AOMs.

Figure 25:
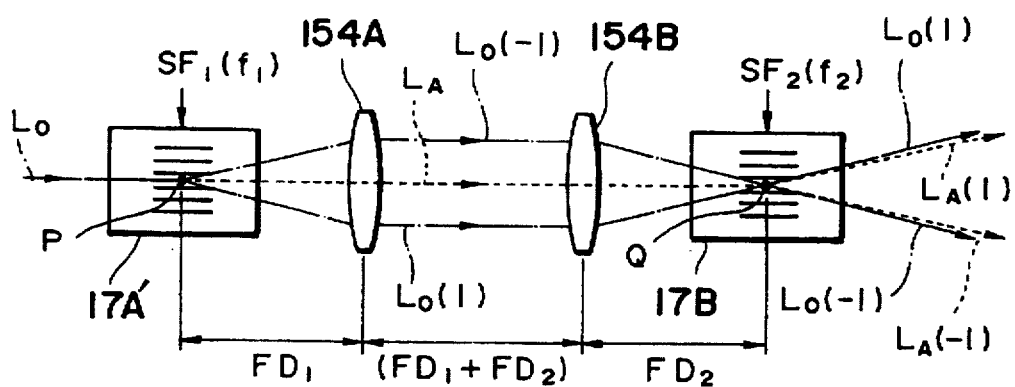
FIG. 25 is a structural drawing to show a modification in which the relay lens system is disposed between the two acousto-optic elements.

FIG. 25 shows a modification including the relay lens system placed as described. In this FIG. 9, the 1:1 relay lens system composed of two lenses 154A and 154B is placed between the first AOM 17A' and the second AOM 17B. The first AOM 17A' is the first AOM 17A of FIG. 24 arranged upside down and having the opposite direction of the traveling wave. Letting $FD_1$ and $FD_2$ be the focal lengths of the lenses 154A and 154B, the center P of the ultrasonic acting region of AOM 17A' is positioned at the front focal point of the lens 154A, the spacing between the two lenses 154A and 154B is set to ($FD_1+FD_2$), and the center Q of the ultrasonic acting region of AOM 17B is positioned at the rear focal point of the lens 154B. Namely, the relay lens system makes the center P of the ultrasonic acting region of AOM 17A' conjugate with the center Q of the ultrasonic acting region of AOM 17B. In this case, the relay lens system composed of the lenses 154A, 154B is desirably bitelecentric. Because of single relay, the directions of the traveling waves in the two AOMs 17A', 17B are set along the same direction.

In this modification, the −first-order diffracted light beam $L_0(-1)$, the +first-order diffracted light beam $L_A(1)$, and the zeroth-order light beam $L_A$ from the center P in the AOM 17A' from the beam L0 incident travel each through the relay lens system to intersect at the center Q in the AOM 17B. Accordingly, from the center Q, the +first-order diffracted light beam $L_A(1)$ from the AOM 17B based on the zeroth-order light $L_A$, and the +first-order diffracted light beam $L_0(1)$ are emergent as almost perfectly overlaid, and the −first-order diffracted light beam $L_A(-1)$ from the AOM 17B based on the zeroth-order light $L_A$, and the −first-order diffracted light beam $L_0(-1)$ are emergent as almost perfectly overlaid. Accordingly, this modification has such advantages that the utilization factor of beam for alignment becomes higher and that the contrast of the optical beat signal obtained becomes higher.

Next explained are modifications of the AOMs. The first modification has three or more AOMs with their traveling waves traveling opposite to each other, as arranged alternately.

Figure 27:
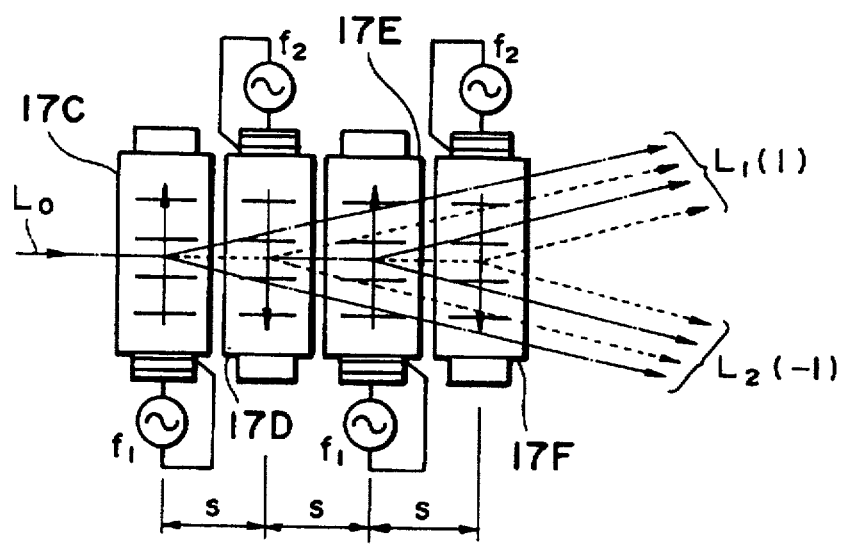
FIG. 27 is a structural drawing to show a first modification of the acousto-optic elements.

FIG. 27 shows the first modification arranged in this manner. In this FIG. 27, the AOMs 17C, 17D, 17E, 17F are positioned in order in the traveling direction of the beam $L_0$ incident, and the traveling wave of the frequency $f_1$ and the traveling wave of the frequency $f_2$ are supplied alternately in opposite directions into the AOMS. Also in this example, spacings s between two adjacent AOMs are set each to satisfy the condition of Eq. (29) or Eq. (30). Then mixture light of the +first-order diffracted light from the AOMs 17C to 17F based on the beam $L_0$ incident becomes the beam $L_1(1)$ and mixture light of the −first-order diffracted light from the AOMs 17C to 17F based on the beam $L_0$ becomes the beam $L_2(-1)$. By interference between these two beams with each other, the optical beat signal is obtained with the beat frequency of $(f_1-f_2)$.

In this case, the plural acousto-optic media of AOMs 17C to 17F may be made of different materials, but the wavelengths of the ultrasonic waves in the respective acousto-optic media are desirably nearly equal. Even if the sound velocities are different because of different materials, the wavelengths $\Lambda$ of the ultrasonic waves can be set to be equal by changing the frequencies f of the ultrasonic waves, because the wavelength $\Lambda=v/f$, using the velocity v and frequency f of ultrasonic wave.

Next explained is the second modification of the AOMs. This example is arranged to supply a plurality of traveling waves alternately in opposite directions inside one acousto-optic medium.

Figure 28:
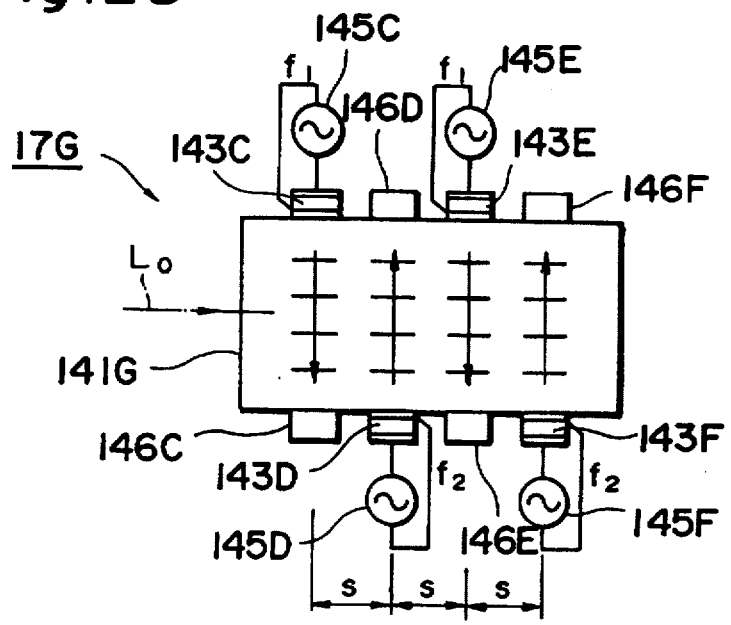
FIG. 28 is a structural drawing to show a second modification of the acousto-optic elements.

FIG. 28 shows the AOM 17G in the second modification. In this FIG. 28, there are a sound absorber 146C, a transducer 143D sandwiched between electrode plates, a sound absorber 146E, and a transducer 143F sandwiched between electrode plates, fixed in order at the spacings s calculated as an air length on one side face of the acousto-optic medium 141G. Further, as opposed to the sound absorber 146C, transducer 143D, sound absorber 146E, and transducer 143F, there are a transducer 143C sandwiched between electrode plates, a sound absorber 146D, a transducer 43E sandwiched between electrode plates, and a sound absorber 146F fixed to the other side face of the acousto-optic medium 141G. Inside the acousto-optic medium 141G the transducers 143C to 143F supply the traveling waves of frequency $f_1$ and the traveling waves of frequency $f_2$ alternately in opposite directions.

Using the AOM 17G of this example, two beams having the predetermined frequency difference can be generated from the beam $L_0$ incident, similarly as in the case of the plurality of AOMs 17C to 17F in FIG. 27 being used.

Figure 29:
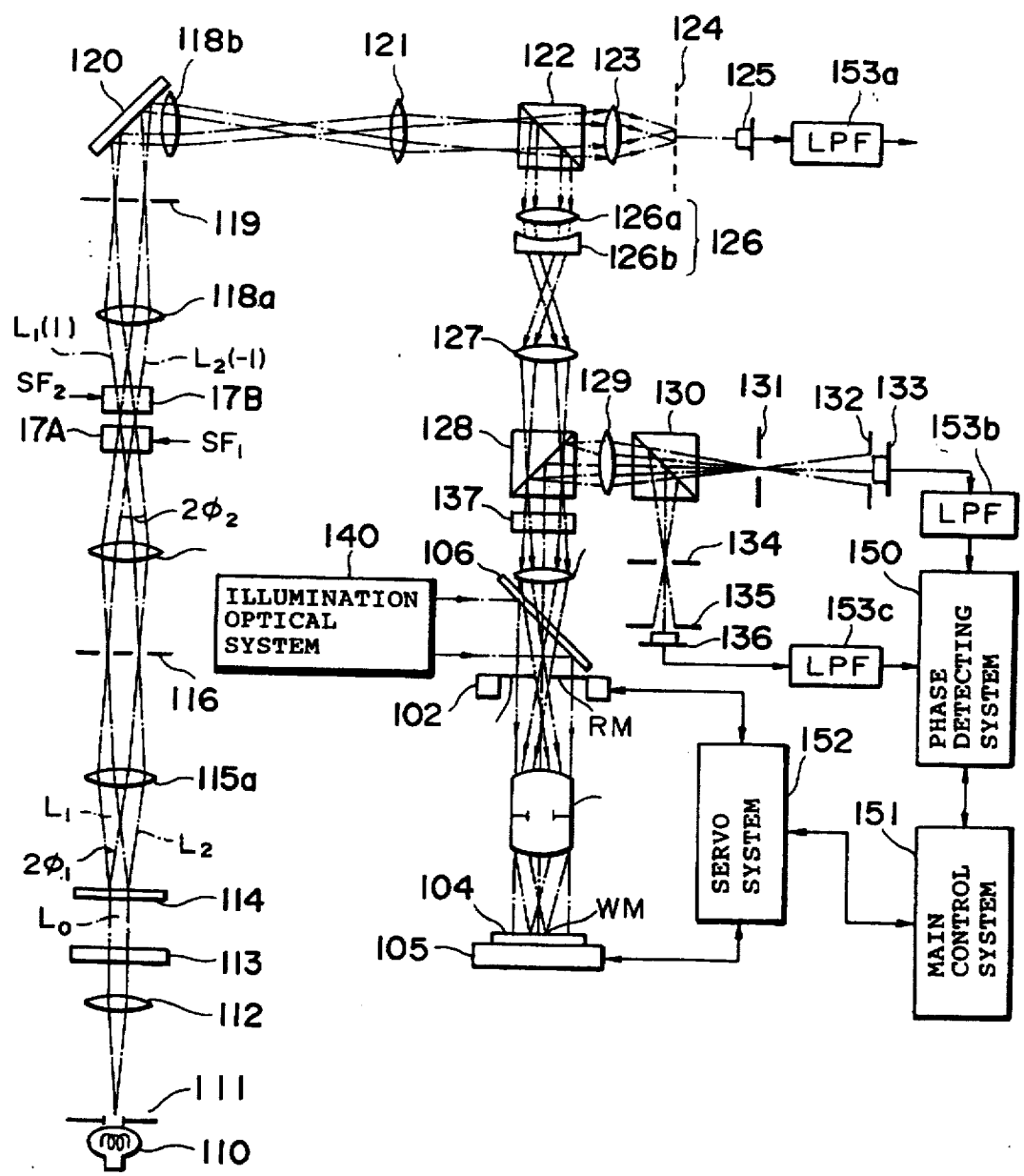
FIG. 29 is a structural drawing to show a schematic configuration of a projection exposure apparatus of the fifth embodiment according to the present invention.

The fifth embodiment of the present invention is next explained referring to FIG. 29. The present embodiment is also an example in which the present invention is applied to the alignment system of the heterodyne interference type in the projection exposure apparatus, and portions of FIG. 29 corresponding to those in FIG. 19 are denoted by the same reference numerals as omitting detailed description thereof. This example is, however, an example in which the acousto-optic modulators are used in Bragg diffraction (acoustic Bragg diffraction) regions.

In FIG. 29, the white light from the white light source 10 is converted through the variable stop 11 with variable aperture and the condenser lens 12 into a parallel beam $L_0$ and thereafter the beam $L_0$ travels through the band-pass filter 13 for extracting the light in the predetermined wavelength region to be normally incident to a diffraction grating 14. The parallel beam $L_0$ normally incident to the diffraction grating 14 is split by the diffraction effect of the diffraction grating 14 into ±first-order diffracted light beams $L_1$, $L_2$ having the predetermined wavelength region.

The ±first-order diffracted light beams (hereinafter simply referred to as "beams") $L_1$, $L_2$ having the predetermined wavelength region are condensed by a relay optical system 15 having lenses 15a and 15b, and thereafter the beams are incident in symmetry at equal incident angles to the AOMs 17A and 17B arranged in series. A spatial filter 16 for extracting the ±first-order diffracted light from the diffraction grating 14 is disposed between the lens 15a and the lens 15b.

The AOMs 17A and 17B are driven in the opposite directions by high-frequency signals $SF_1$ and $SF_2$ of the respective frequencies $f_1$ and $f_2$ ($f_1 > f_2$), respectively, and the beams $L_1$ and $L_2$ in the predetermined wavelength region are subjected to the Bragg diffraction by the AOMs 17A, 17B. In the following description, the orders of diffracted light are taken with respect to the traveling direction of the traveling wave by the high-frequency signal $SF_1$.

Letting $f_0$ be the center frequency of the beams $L_1$ and $L_2$ in the predetermined wavelength region, mixture light of the +first-order diffracted light by the first AOM 17A from the beam $L_1$ with the +first-order diffracted light by the second AOM 17B becomes the beam $L_1(1)$, and mixture light of the −first-order diffracted light by the AOM 17A from the beam $L_2$ with the −first-order diffracted light by the AOM 17B becomes the beam $L_2(-1)$. Then the beam $L_1(1)$ is frequency-modulated by the two AOMs 17A, 17B to substantially $(f_1-f_2)/2$, while the other beam $L_2(-1)$ is frequency-modulated by the two AOMs 17A, 17B to substantially $-(f_1-f_2)/2$. The beat frequency of interference light between those two beams is beaten down to $(f_1-f_2)$.

After that, the beam $L_1(1)$ and the beam $L_2(-1)$ travel via the lens 18a, reflecting mirror 20, lens 18b, and lens 21 to be split each into two by the beam splitter 22. The spatial filter 19 for extracting the beam $L_1(1)$ and the beam $L_2(-1)$ is disposed in the relay optical system composed of the lens 18a and lens 18b. The zeroth-order light and higher-order diffracted light beam also occur from the AOMs 17A, 17B, but they are interrupted by the spatial filter 19. The other arrangement is the same as in the embodiment of FIG. 19, and thus the description thereof is omitted herein.

Figure 30:
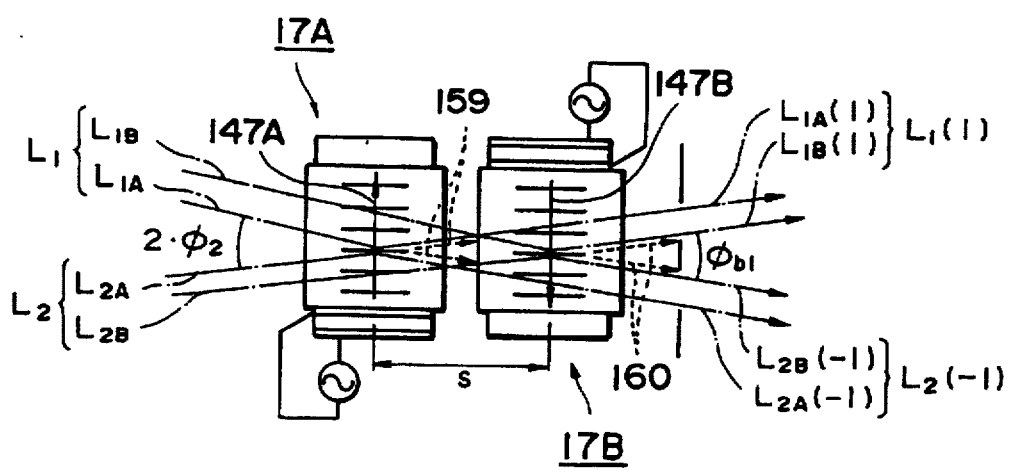
FIG. 30 is an enlarged drawing to show a configuration of a portion for generating two beams of different frequencies by the Bragg diffraction in the fifth embodiment.

Next explained referring to FIG. 29 and FIG. 30 are a more specific configuration and the principle of the portion for generating the two beams of the mutually different frequencies in the fifth embodiment shown in FIG. 29.

In FIG. 29, when the beam $L_0$ of white light is normally incident to the diffraction grating 14, diffracted light of all orders appears for every wavelength by the diffraction effect of the diffraction grating 14.

On this occasion, the diffracted light of the orders satisfying the following equation (45) occurs where $\phi_1$ is an angle of diffraction of the diffracted light relative to the direction normal to the diffraction grating 14, $P_G$ the pitch of the diffraction grating 14, $\lambda$ the wavelength of light, and N (integer) the order of the diffracted light.

$$\sin \phi_1 = N\lambda/P_G \tag{45}$$

Then the diffracted light of the orders in the predetermined wavelength band, passing through the condenser lens 15a, is filtered by the spatial filter 16 positioned at the rear focal point of the condenser lens 15a (or at the front focal point of the condenser lens 15b), so as to interrupt the light other than the ±first-order diffracted light in the predetermined wavelength band, whereby only the ±first-order diffracted light $L_1$, $L_2$ in the predetermined wavelength band is selected to travel through the condenser lens 15b toward the AOM 17A.

Here, let us consider the angle of diffraction of the ±first-order diffracted light $L_1$, $L_2$ passing through the spatial filter 16. For example, when the center wavelength $\lambda_0$ of the illumination light $L_0$ is 633 nm, the wavelength band of the beam $L_0$ is ($\lambda_0 \pm \Delta\lambda$) (where $\Delta\lambda$ is 20 nm), and the pitch of the diffraction grating 14 is 4 μm, the diffraction angle of the ±first-order diffracted light at the shortest wavelength of 613 nm is 8.82° from Eq. (B6), and the diffraction angle of the ±first-order diffracted light at the longest wavelength of 653 nm is 9.40° from Eq. (45).

Accordingly, the light in the wavelength band between 613 nm and 653 nm generates the ±first-order diffracted light of the diffraction angles in the range of 8.82° to 9.40°.

As explained above, the diffraction angle $\phi_1$ changes depending upon the wavelength of light. In the present embodiment, because the diffraction point of the diffraction grating 14 is relayed to the middle point between the AOMs 17A, 17B by the relay optical system 15a, 15b and the ±first-order diffracted light of each wavelength is focused at the middle point between the AOMs 17A, 17B, the ±first-order diffracted light $L_1$, $L_2$ in the predetermined wavelength band, split each into two in symmetry by the diffraction grating 14, is incident at the incidence angle $\phi_2$ predetermined every wavelength in symmetry to the AOMs 17A, 17B. This will be explained with equations.

FIG. 30 is an enlarged view of the two AOMs 17A, 17B in FIG. 29. In this FIG. 30, the ±first-order diffracted light $L_1$, $L_2$ in the predetermined wavelength region is incident at the incident angle $\phi_2$ in two directions to the AOM 17A, in which some beams $L_{1A}$ and $L_{2A}$ of each diffracted light are subjected to the acoustic Bragg diffraction by the first AOM 17A, but the rest beams $L_{1B}$, $L_{2B}$ of each diffracted light pass through the AOM 17A as they are, thereby entering the AOM 17B in symmetry. Then the rest beams $L_{1B}$, $L_{2B}$ are subjected to the acoustic Bragg diffraction by the second AOM 17B.

In this case, the first AOM 17A is driven by the high-frequency signal $SF_1$ of the frequency $f_1$ by which the diffraction angle of the +first-order diffracted light $L_{1A}(1)$ of the beam $L_{1A}$ and the diffraction angle of the −first-order diffracted light $L_{2A}(-1)$ of the beam $L_{2A}$ both become approximately $2\phi_2$ (the double of the incident angle $\phi_2$). The second AOM 17B is driven by the high-frequency signal $SF_2$ of the frequency $f_2$ (a little smaller than the frequency $f_1$) by which the diffraction angle of the +first-order diffracted light $L_{1B}(1)$ of the beam $L_{1B}$ and the diffraction angle of the −first-order diffracted light $L_{2B}(-1)$ of the beam $L_{2B}$ both become approximately $2\phi_2$.

Now, letting $\theta_{b1}(=2\phi_2)$ be an average value of diffraction angles by the Bragg diffraction of the AOMs 17A, 17B, v be an average value of velocities of the traveling waves (ultrasonic waves) 147A, 147B traversing in the AOMs 17A, 17B, and $\lambda$ be the wavelength of light, the following relations of Eq. (46) and Eq. (47) hold as to the average value $\Lambda$ of the wavelengths of the ultrasonic waves 147A, 147B (traveling waves) traversing the AOMs 17A, 17B therein and as to the average value $\theta_{b1}$ of the diffraction angles.

$$\Lambda = v/f, \ (f=(f_1+f_2)/2) \tag{46}$$

$$\sin \theta_{b1} = \lambda/\Lambda \tag{47}$$

From Eq. (46) and Eq. (47), the average value $\theta_{b1}$ (=$2\phi_2$) of the diffraction angles by the AOMs 17A, 17B is finally obtained as follows.

$$\sin \theta_{b1} = f\lambda/v \text{ (or } \sin 2\phi_2 = f\lambda/v) \qquad (48)$$

Accordingly, the beam $L_1(1)$ consisting of the +first-order diffracted light $L_{1A}(1)$ from the AOM 17A and the +first-order diffracted light $L_{1B}(1)$ from the AOM 17B, and the beam $L_2(-1)$ consisting of the −first-order diffracted light $L_{2A}(-1)$ from the AOM 17A and the first-order diffracted light $L_{2B}(-1)$ from the AOM 17B are emergent at the diffraction angle satisfying Eq. (B9) for every wavelength in symmetry from the AOM 17B.

Assuming that the magnification of the relay optical system 15a, 15b in FIG. 29 is $\beta_1$ and that the relay optical system 15a, 15b satisfies the sine condition, the following relation holds.

$$\beta_1 = \sin \phi_1/\sin \phi_2 = 2 \sin \phi_1/\sin (2\phi_2) \qquad (49)$$

From Eq. (45), Eq. (48), and Eq. (49), Eq. (50) below is derived.

$$\beta_1 = (2v)/(P_G f) \qquad (50)$$

Therefore, the relay optical system 15a, 15b is desirably arranged to satisfy above Eq. (50).

In FIG. 14, the spacing s between the center of the ultrasonic acting region of the AOM 17A and the center of the ultrasonic acting region of the AOM 17B is set so that the phase difference $\phi_{BR}$ between the +first-order diffracted light $L_{1A}(1)$ (or the −first-order diffracted light $L_{2A}(-1)$) from the AOM 17A and the +first-order diffracted light $L_{1B}(1)$ (or the −first-order diffracted light $L_{2B}(-1)$) from the AOM 17B may drop within the following range, using an integer m.

$$(m-\tfrac{1}{3})^\pi < \phi_{BR} < (m+\tfrac{1}{3})^\pi \qquad (51)$$

This makes the contrast of the optical beat signal obtained be ½ or more when the beams $L_1(1)$ and $L_2(-1)$ interfere with each other, whereby position detection can be performed accurately. It is apparent that the phase difference $\phi_{BR}$ is preferably as close to $m^\pi$ as possible.

In FIG. 30, in order to prevent the zeroth-order light 159 of the beams $L_{1A}$ and $L_{2A}$ in the AOM 17A and the zeroth-order light 160 of the beams $L_{1B}$ and $L_{2B}$ in the AOM 17B from mixing into the beam $L_2(-1)$ and the beam $L_1(1)$, the traveling direction of each traveling wave 147A, 147B is arranged not to be parallel with a plane subtended by the two beams $L_1$, $L_2$ incident. This arrangement allows the spatial filter 19 of FIG. 29 to completely remove the zeroth-order light 159 and 160.

Further, the fifth embodiment as described above is arranged in such a manner that the white light (multi-wavelength light) supplied from the light source means (10 to 12) is split in symmetry with respect to the incidence direction (in the optical-axis direction) by the diffraction grating 14 as a beam splitting means, as shown in FIG. 30, but the beam splitting means may be one different from the diffraction grating 14.

For example, it may be a Wollaston prism 140 as shown in FIG. 16. Further, as shown in FIG. 16, the apparatus may be modified so that beams of wavelengths $\lambda_1$ to $\lambda_3$ emitted from a plurality of single-color light sources 100 to 102 are coaxially synthesized using a reflection type diffraction grating 103 to obtain a beam $L_0$ and so that this beam $L_0$ is used instead of the beam $L_0$ emitted from the white light source of FIG. 19 or FIG. 29.

In each embodiment shown in FIG. 19 and FIG. 29, the beat signal of the predetermined frequency is extracted by the optical beat signal extracting portion inside the phase difference detecting system 50 from the signal photoelectrically detected by each photoelectric detector 25, 33, 36. However, the optical beat signal extracting portion (Fourier transform circuit) may be positioned in an electric path between each photoelectric detector 25, 33, 36 and the phase difference detecting system 50, and the photoelectric signal output from each photoelectric detector 25, 33, 36 may be independently subjected to Fourier transformation.

As described, the present invention is not limited to the above embodiments, but may have various arrangements and modifications within the scope not departing from the spirit and essence of the present invention.

Since the position detecting apparatus of the present invention can obtain the optical beat signal from light of plural wavelengths (including white light) with necessity, the negative effect due to asymmetry of each diffraction grating mark can be suppressed by the averaging effect by the optical beat signals of respective wavelengths, i.e., by a plurality of optical beat signals. In addition, because the diffraction grating mark on the detected surface is irradiated by the multi-wavelength light (white light), the present invention can achieve high-accuracy position detection by the heterodyne interference method as overcoming the influence of thin-film interference in the photoresist layer or the like.

Further, after the multi-wavelength light (white light) is split in symmetry with respect to the incidence direction by the two-beam generating means, the beams propagate in symmetry and in parallel with respect to the optical axis in each optical system, and, therefore, no optical path difference theoretically occurs between the separate beams. Since the wavefronts are thus aligned between the separate beams, high-accuracy positioning can be achieved and the compact apparatus easy in adjustment can be realized. Further, by the simple arrangement that the ultrasonic waves flowing alternately in opposite directions are supplied into the plurality of acousto-optic modulators disposed adjacent to each other, the optical beat signal can be obtained at the low frequency beaten down either in the case of the Raman-Nath diffraction utilized or in the case of the Bragg diffraction utilized.

When the condition of Eq. (28) is satisfied as to the phase difference $\phi$ between the diffracted light from two adjacent acousto-optic modulators, the optical beat signal can be obtained with high contrast, i.e., with high SN ratio by photoelectrically converting the interference light between plural diffracted light. This presents such an advantage that the utilization factor of light for position detection also becomes high.

By the arrangement that the relay optical system is positioned between two, predetermined, adjacent, acousto-optic modulators out of the plurality of acousto-optic modulators and that the ultrasonic acting regions in the two, predetermined, adjacent, acousto-optic modulators are located at the positions conjugate with each other with respect to the relay optical system, the spacing between the two adjacent acousto-optic modulators can be substantially 0, which can maximize the contrast of the optical beat signal obtained. In addition, there is no positional deviation between the diffracted light from the two adjacent acousto-optic modulators, which presents the advantage that the utilization factor of light is maximized.

When the field stop for interrupting the noise light in the periphery of the two beams having mutually different frequencies is provided at the position substantially conjugate with the middle point in the traveling direction of the incident beam between the ultrasonic acting regions in the plural acousto-optic modulators, beams irrelevant to position detection are cut, which can further improve the contrast (SN ratio) of the optical beat signal obtained.

It should be noted that the present invention is by no means limited to the embodiments as described above, but may have various arrangements and modifications within a range not departing from the essence of the present invention.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Applications No. 6-126364 (126364/1994) filed on Jun. 8, 1994, No. 4-187198 (187198/1992) filed on Jul. 15, 1992, No. 5-24441 (24441/1993) filed on Feb. 12, 1993, No. 5-29530 (29530/1993) filed on Feb. 19, 1993, No. 5-29531 (29531/1993) filed on Feb. 19, 1993, and No. 7-53849 (53849/1995) filed on Mar. 14, 1995 are hereby incorporated by reference.

What is claimed is:

1. An acousto-optic modulator for splitting a light beam incident thereinto into two light beams of mutually different frequencies, comprising:
   an acousto-optic medium; and
   an ultrasonic generator for generating two progressive waves of mutually different frequencies in an ultrasonic acting area in said acousto-optic medium.

2. An acousto-optic modulator according to claim 1, wherein said two progressive waves travel in a superimposed manner in said ultrasonic acting area.

3. An acousto-optic modulator according to claim 1, wherein said two progressive waves travel in first and second regions separately present in said ultrasonic acting area.

4. An acousto-optic modulator according to claim 3, wherein said first and second regions are present in a same acousto-optic medium.

5. An acousto-optic modulator according to claim 3, wherein said first and second regions are present in separate acousto-optic media.

6. An acousto-optic modulator according to claim 1, wherein traveling directions of said two progressive waves are opposite to each other.

7. An acousto-optic modulator according to claim 1, wherein traveling directions of said two progressive waves are coincident with each other.

8. An acousto-optic modulator according to claim 1, wherein said ultrasonic generator comprises:
   a transducer disposed on a first surface of said acousto-optic medium, for generating an ultrasonic wave; and
   a sound absorbing member disposed on a second surface of said acousto-optic medium which is opposite to said first surface with respect to said acousto-optic medium.

9. A position detecting apparatus comprising:
   a light source system for supplying a light beam of a single wavelength or a light beam containing light of a plurality of wavelengths;
   an acousto-optic medium into which the light beam from said light source system is incident;
   an ultrasonic generator for generating two progressive waves of mutually different frequencies in an ultrasonic acting area in said acousto-optic medium, splitting a light beam incident into said acousto-optic medium into two light beams of mutually different frequencies, and making the two light beams thus split emergent from said acousto-optic medium;
   an objective optical system for condensing the two light beams emergent from said acousto-optic medium and applying the two light beams thus condensed to a diffraction-grating-like mark on a measured object in two predetermined directions;
   a photoelectric detector for photoelectrically detecting interference light formed by a plurality of diffracted light beams appearing from said diffraction-grating-like mark; and
   a processing apparatus for detecting a position of the measured object, based on a detection signal from said photoelectric detector.

10. A position detecting apparatus according to claim 9, wherein traveling directions of the two progressive waves generated in said ultrasonic acting area are opposite to each other.

11. A position detecting apparatus according to claim 9, wherein said two progressive waves are generated in first and second regions in said ultrasonic acting area, said first and second regions are adjacent to each other, and traveling directions of said two progressive waves are coincident with each other.

12. A projection exposure apparatus comprising:
   an illumination optical system for supplying an illumination light beam;
   a first stage for supporting an illuminated object illuminated by the light beam from said illumination optical system;
   a second stage for supporting an exposed object;
   a projection optical system for making a position on the illuminated object supported by said first stage conjugate with a position on the exposed object supported by said second stage;
   a light source system for supplying a light beam of a single wavelength or a light beam containing light of a plurality of wavelengths;
   an acousto-optic medium into which the light beam from said light source system is incident;
   an ultrasonic generator for generating two progressive waves of mutually different frequencies in an ultrasonic acting area in said acousto-optic medium, splitting the light beam incident into said acousto-optic medium into two light beams of mutually different frequencies, and making the two light beams thus split emergent from said acousto-optic medium;
   an objective optical system for condensing the two light beams emergent from said acousto-optic medium and applying the two light beams thus condensed to a diffraction-grating-like mark on the illuminated object or on the exposed object in two predetermined directions;
   a photoelectric detector for photoelectrically detecting interference light formed by a plurality of diffracted light beams appearing from said diffraction-grating-like mark; and
   a processing apparatus for detecting a position of the illuminated object or the exposed object provided with said diffraction-grating-like mark, based on a detection signal from said photoelectric detector.

13. A position detecting apparatus having two-beam generating means for generating two beams having mutually different frequencies, an objective optical system for condensing the two beams from said two-beam generating means to project said two beams in two predetermined directions to a diffraction grating mark formed on a detected object, and a photoelectric detector for photoelectrically detecting interference light consisting of a plurality of diffracted light occurring from said diffraction grating mark, which is arranged to detect a position of said detected object, based on a detection signal of said photoelectric detector, wherein said two-beam generating means comprises light source means for generating a beam containing light of plural wavelengths or a beam of a single wavelength, and a plurality of acousto-optic elements for generating two beams of mutually different frequencies from the beam from said light source means, wherein traveling directions of ultrasonic waves in said plurality of acousto-optic elements are set to be alternately opposite to each other, and wherein a spacing in a traveling direction of said beam between ultrasonic acting regions of two adjacent acousto-optic elements out of said plurality of acousto-optic elements is set so that a phase difference ø between diffracted light in a same direction from the ultrasonic acting regions of said two adjacent acousto-optic elements is within the following range, using an integer m:

$$(m-\tfrac{1}{3})\pi < \phi < (m+\tfrac{1}{3})\pi.$$

14. The position detecting apparatus according to claim 13, wherein the spacing s, calculated as a value in the air in the traveling direction of said beam between the ultrasonic acting regions of the two adjacent acousto-optic elements out of said plurality of acousto-optic elements, is within the range expressed by:

$$(m-\tfrac{1}{3})\Lambda^2/\lambda < s < (m+\tfrac{1}{3})\Lambda^2/\lambda$$

or, $$(m-\tfrac{1}{3})v^2/(\lambda f^2) < s < (m+\tfrac{1}{3})v^2/(\lambda f^2)$$

where $\lambda$ is an average wavelength in the air of said two beams having the mutually different frequencies, $\Lambda$ is an average wavelength of the ultrasonic waves in said two adjacent acousto-optic elements, v is a sound velocity of said ultrasonic waves, f is an average frequency of said ultrasonic waves, and m is an integer.

15. The position detecting apparatus according to claim 13, wherein a relay optical system is positioned in two, predetermined, adjacent, acousto-optic elements out of said plurality of acousto-optic elements and wherein the ultrasonic acting regions in said two, predetermined, adjacent, acousto-optic elements are located at positions conjugate with each other with respect to said relay optical system.

16. The position detecting apparatus according to claim 13, wherein a field stop for interrupting noise light in a peripheral region of said two beams having the mutually different frequencies is provided at a position substantially conjugate with a middle point in the traveling direction of said beam between the ultrasonic acting regions of said plurality of acousto-optic elements.

17. An acousto-optic modulator for generating two beams having mutually different frequencies from a beam containing light of plural wavelengths or a beam of a single wavelength incident therein, comprising:

a plurality of acousto-optic elements for generating two beams of mutually different frequencies from the beam from said light source means, wherein traveling directions of ultrasonic waves in said plurality of acousto-optic elements are set to be alternately opposite to each other, and wherein a spacing in a traveling direction of said beam between ultrasonic acting regions of two adjacent acousto-optic elements out of said plurality of acousto-optic elements is set so that a phase difference ø between diffracted light in a same direction from the ultrasonic acting regions of said two adjacent acousto-optic elements is within the following range, using an integer m:

$$(m-\tfrac{1}{3})\pi < \phi < (m+\tfrac{1}{3})\pi.$$

18. The acousto-optic modulator according to claim 17, wherein the spacing s, calculated as a value in the air in the traveling direction of said beam between the ultrasonic acting regions of the two adjacent acousto-optic elements out of said plurality of acousto-optic elements, is within the range expressed by:

$$(m-\tfrac{1}{3})\Lambda^2/\lambda < s < (m+\tfrac{1}{3})\Lambda^2/\lambda$$

or, $$(m-\tfrac{1}{3})v^2/(\lambda f^2) < s < (m+\tfrac{1}{3})v^2/(\lambda f^2)$$

where $\lambda$ is an average wavelength in the air of said two beams having the mutually different frequencies, $\Lambda$ is an average wavelength of the ultrasonic waves in said two adjacent acousto-optic elements, v is a sound velocity of said ultrasonic waves, f is an average frequency of said ultrasonic waves, and m is an integer.

19. The acousto-optic modulator according to claim 17, further comprising a relay optical system positioned in two, predetermined, adjacent, acousto-optic elements out of said plurality of acousto-optic elements and wherein the ultrasonic acting regions in said two, predetermined, adjacent, acousto-optic elements are located at positions conjugate with each other with respect to said relay optical system.

20. The position detecting apparatus according to claim 17, further comprising a field stop for interrupting noise light in a peripheral region of said two beams having the mutually different frequencies which is provided at a position substantially conjugate with a middle point in the traveling direction of said beam between the ultrasonic acting regions of said plurality of acousto-optic elements.

21. A projection exposure apparatus according to claim 12, wherein said two progressive waves of mutually different frequencies travel alternately in opposite directions.

22. A projection exposure apparatus according to claim 12, wherein said two progressive waves of mutually different frequencies are separated in said acousto-optic medium from each other so that the separated waves progress to first and second regions, respectively.

23. A projection exposure apparatus according to claim 22, wherein said acousto-optic medium comprises a first medium element and a second medium element which are separated from each other, said first region being on said first medium element and said second region being on said second medium element.

24. A projection exposure apparatus according to claim 23, wherein progressive waves respectively traveling on said first medium element and said second medium element travel alternately in opposite directions.

25. A position detecting apparatus comprising:
   a light source for supplying light of a single wavelength or a light of a plurality of wavelengths;
   two-beam generating system including an acousto-optic medium for generating two beams having mutually different frequencies based on light from said light source;
   an objective optical system for condensing the two beams from said two-beam generating system to project said two beams to a diffraction grating like mark formed on a detected object;
   a detector for photo-electrically detecting diffracted light from said diffraction grafting like mark;
   a processing system for detecting a position of said detected object based on a detection signal from said detector; and
   a progressive wave generator for applying two progressive waves having mutually different frequencies to an ultrasonic acting area of said acousto-optic medium to cause a predetermined frequency difference in said two beams guided from said objective optical system.

26. A position detecting apparatus according to claim 25, wherein said two beam generating system includes a dividing member for dividing the light from said light source into two beams to guide the divided beams to said acousto-optic medium.

27. A position detecting apparatus according to claim 25, wherein said two progressive waves of mutually different frequencies travel alternately in opposite directions.

28. A position detecting apparatus according to claim 26, wherein said two progressive waves have mutually different frequencies which travel alternately in opposite directions.

29. A position detecting apparatus according to claim 25, wherein said two progressive waves having mutually different frequencies travel in first and second regions which separately exist on said acousto-optic medium.

30. A position detecting apparatus according to claim 29, wherein said two progressive waves of mutually different frequencies are separated in said acousto-optic medium from each other so that the separated waves progress to first and second regions, respectively.

31. A projection exposure apparatus according to claim 29, wherein said acousto-optic medium includes a first medium element and a second medium element which are separated from each other, said first region being on said first medium element and said second region being on said second medium element.

32. A projection exposure apparatus according to claim 31, wherein said two progressive waves respectively travelling on said first medium element and said second medium element travel alternately in opposite directions.

33. An exposure apparatus comprising:
   a illumination unit for illuminating a reticle on which a predetermined pattern image is formed, with a light for exposure;
   a first stage for holding said reticle;
   a projection system for projecting said predetermined pattern image on said reticle on a substrate;
   a second stage for holding said substrate; and
   a position detecting apparatus for detecting a position of a positioning mark formed on either one of said reticle and said substrate, said position detecting apparatus including:
   a light source for supplying light of a single wavelength or light of a plurality of wavelengths;
   a two-beam generating system including an acousto-optic medium for generating two beams having mutually different frequencies based on said light from said light source;
   an objective optical system for condensing the two beams from said two-beam generating system to project said two beams to a diffraction grating mark formed on a detected object;
   a detector for photo-electrically detecting diffracted light from said diffraction grating mark;
   a processing system for detecting a position of said detected object based on a detection signal from said detector; and
   a progressive wave generator for applying two progressive waves having mutually different frequencies to an ultrasonic acting area of said acousto-optic medium to cause a predetermined frequency difference in said two beams guided from said objective optical system.

34. An exposure apparatus according to claim 33, wherein said two beam generating system includes a dividing member for dividing the light from said light source into two beams to guide the divided beams to said acousto-optic medium.

35. An exposure apparatus according to claim 34, wherein said two progressive waves of mutually different frequencies travel alternately in opposite directions.

36. An exposure apparatus according to claim 33, wherein said two progressive waves have mutually different frequencies which travel alternately in opposite directions.

37. An exposure apparatus according to claim 33, wherein said acousto-optic medium includes a first medium element and a second medium element which are separated from each other, said first region being on said first medium element and said second region being on said second medium element.

38. An exposure apparatus according to claim 37, wherein said two progressive waves of mutually different frequencies travel alternately in opposite directions.

39. An exposure apparatus according to claim 37, wherein said acousto-optic medium includes a first medium element and a second medium element which are separated from each other, said first region being on said first medium element and said second region being on said second medium element.

40. An exposure apparatus according to claim 39, wherein progressive waves respectively travel on said first medium element and said second medium element travel alternately in opposite directions.

41. A method of manufacturing a semiconductor device or a liquid display apparatus using the projection exposure apparatus according to claim 12, said method comprising the steps of:
   illuminating said illuminated object by said illumination optical system; and transferring an image of said illuminated object on an exposure object.

42. A method of manufacturing a semiconductor device or a liquid display apparatus using the projection exposure apparatus according to claim 24, said method comprising the steps of:
   illuminating said illuminated object by said illumination optical system; and transferring an image of said illuminated object on an exposure object.

43. A method of manufacturing a semiconductor device or a liquid display apparatus using the exposure apparatus according to claim 33, said method comprising the steps of:

illuminating said reticle by said illumination optical system; and transferring said image of the said reticle on said substrate.

44. A method of manufacturing a semiconductor device or a liquid display apparatus using the exposure apparatus according to claim 34, said method comprising the steps of:

illuminating said reticle by said illumination optical system; and transferring said image of the said reticle on said substrate.

45. A method of manufacturing a semiconductor device or a liquid display apparatus using the exposure apparatus according to claim 40, said method comprising the steps of:

illuminating said reticle by said illumination optical system; and transferring said image of the said reticle on said substrate.

* * * * *